US012471246B2

(12) United States Patent
Okada et al.

(10) Patent No.: US 12,471,246 B2
(45) Date of Patent: Nov. 11, 2025

(54) COOLING APPARATUS, CIRCULATION-TYPE COOLING SYSTEM, AND ELECTRONIC INSTRUMENT

(71) Applicant: SEIKO EPSON CORPORATION, Tokyo (JP)

(72) Inventors: Naoya Okada, Matsumoto (JP); Takahiro Miyata, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 230 days.

(21) Appl. No.: 18/330,425

(22) Filed: Jun. 7, 2023

(65) Prior Publication Data

US 2023/0397366 A1 Dec. 7, 2023

(51) Int. Cl.
*H05K 7/20* (2006.01)
*G03B 21/16* (2006.01)

(52) U.S. Cl.
CPC ......... *H05K 7/20263* (2013.01); *G03B 21/16* (2013.01); *H05K 7/20272* (2013.01); *H05K 7/20318* (2013.01); *H05K 7/20409* (2013.01)

(58) Field of Classification Search
CPC ........... H05K 7/20263; H05K 7/20272; H05K 7/20318; H05K 7/20409; G03B 21/16; F28D 15/00
USPC .......................................................... 361/699
See application file for complete search history.

(56) References Cited

U.S. PATENT DOCUMENTS 7,796,389 B2 * 9/2010 Edmunds ............ F28D 15/0233 361/679.52
8,014,150 B2 * 9/2011 Campbell .......... H05K 7/20809 165/185
2009/0065178 A1 * 3/2009 Kasezawa ............. H01L 23/473 165/104.19
2009/0266515 A1 * 10/2009 Oikawa .............. H05K 7/20272 165/104.31
2012/0186787 A1 * 7/2012 Dinh ....................... F28D 15/06 165/104.26
2014/0307389 A1 * 10/2014 Arvelo .................. H01L 23/473 29/890.035
2020/0315069 A1 * 10/2020 Chiu .................. H05K 7/20772

FOREIGN PATENT DOCUMENTS

CN 113784571 A * 12/2021 ......... H05K 7/20272
JP 2008-311399 A 12/2008
JP 2011-018940 A 1/2011

* cited by examiner

*Primary Examiner* — Jayprakash N Gandhi
*Assistant Examiner* — Kyle Oxenknecht
(74) *Attorney, Agent, or Firm* — Dority & Manning, P.A.

(57) ABSTRACT

A cooling apparatus includes a first vapor chamber which is formed of a combination of a first plate that receives heat from a heat source and a second plate facing the first plate, a liquid cooling section which includes a liquid cooling container combined with the first vapor chamber, and a plurality of first fins which are provided in the liquid cooling section and form a part of a channel of the liquid refrigerant. The second plate has a first inner surface constituting region which is located at the outer surface of the second plate and forms at least a part of a first inner surface of the liquid cooling section. The plurality of first fins are disposed in the first inner surface constituting region. The liquid cooling section has an introduction port and a discharge port.

20 Claims, 13 Drawing Sheets

COOLING APPARATUS, CIRCULATION-TYPE COOLING SYSTEM, AND ELECTRONIC INSTRUMENT

The present application is based on, and claims priority from JP Application Serial Number 2022-092087, filed Jun. 7, 2022, the disclosure of which is hereby incorporated by reference herein in its entirety.

BACKGROUND

1. Technical Field

The present disclosure relates to a cooling apparatus, a circulation-type cooling system, and an electronic instrument.

2. Related Art

There is a known heat sink that is a combination of a sealed two-phase thermosiphon section and a water-cooling jacket section (see JP-A-2008-311399, for example).

An electronic device that is a heat source is attached to a part of the outer surface of the thermosyphon section. Pure water as a working fluid is housed in the thermosiphon section. The water-cooling jacket section is provided so as to face the thermosiphon section, and cooling water flows in the water-cooling jacket section.

In the thus configured heat sink, the heat transferred from the electronic device to the thermosyphon section causes the pure water in the thermosyphon section to boil, and the vapor generated by the boiling condenses at the wall surface of the water-cooling jacket section. The heat required for the condensation is transmitted to the cooling water flowing in the water-cooling jacket section and carried out of the heat sink. The electronic device is thus cooled.

In the heat pipe described in JP-A-2008-311399, however, the primary portion of the heat transferred from the thermosyphon section to the water-cooling jacket section is transmitted to the cooling water at the wall surface between the thermosyphon section and the water-cooling jacket section. Therefore, when the wall surface has a small area, there is a problem of inefficient transfer of the heat transferred from the thermosyphon section to the cooling water.

There has therefore been a demand for a configuration capable of cooling a cooling target more efficiently.

SUMMARY

A cooling apparatus according to a first aspect of the present disclosure includes a first vapor chamber which is formed of a combination of a first plate that receives heat from a heat source and a second plate facing the first plate and in which a first working fluid encapsulated in the first vapor chamber vaporizes and condenses, a liquid cooling section which includes a liquid cooling container combined with the first vapor chamber and in which a liquid refrigerant flowing in the liquid cooling section flows along the first vapor chamber, and a plurality of first fins which are provided in the liquid cooling section and form a part of a channel of the liquid refrigerant. The second plate has a first inner surface constituting region which is located at an outer surface of the second plate and forms at least a part of a first inner surface of the liquid cooling section. The plurality of first fins are disposed in the first inner surface constituting region. The liquid cooling section has an introduction port via which the liquid refrigerant is introduced from a region outside the liquid cooling section into the liquid cooling section, and a discharge port via which the liquid refrigerant flowing in the liquid cooling section is discharged to the region outside the liquid cooling section.

A circulation-type cooling system according to a second aspect of the present disclosure includes the cooling apparatus according to the first aspect described above, a pump which causes the liquid refrigerant to flow to the introduction port, and a radiator which cools the liquid refrigerant discharged via the discharge port.

An electronic instrument according to a third aspect of the present disclosure includes a heat source and the circulation-type cooling system according to the second aspect described above.

DESCRIPTION OF EXEMPLARY EMBODIMENTS

First Embodiment

A first embodiment of the present disclosure will be described below with reference to the drawings.

Schematic Configuration of Electronic Instrument

Figure 1:
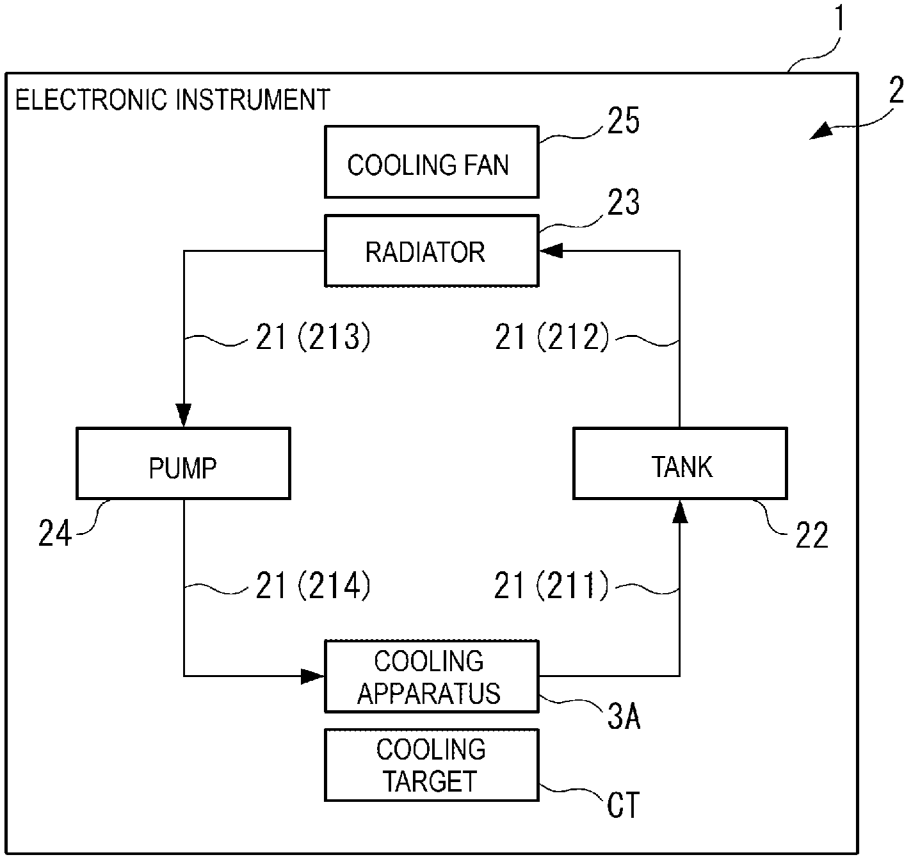
FIG. 1 is a block diagram showing the configuration of an electronic instrument according to a first embodiment.

FIG. 1 is a block diagram showing the configuration of an electronic instrument 1 according to the present embodiment.

The electronic instrument 1 according to the present embodiment includes a cooling target CT and a circulation-type cooling system 2, as shown in FIG. 1.

The cooling target CT constitutes a part of the electronic instrument 1. Examples of the cooling target CT may include a controller that controls the electronic instrument 1 and a power supply apparatus that supplies electronic parts of the electronic instrument 1 with electric power. Specifically, when the electronic instrument 1 is a projector that projects images, a light source can be presented by way of example as the cooling target CT.

Configuration of Circulation-Type Cooling System

The circulation-type cooling system 2 cools the cooling target CT. The circulation-type cooling system 2 is hereinafter abbreviated to a cooling system 2 in some cases. In detail, the cooling system 2 cools the cooling target CT by circulating a liquid refrigerant, transferring heat transferred from the cooling target CT to the liquid refrigerant, and dissipating the transferred heat of the liquid refrigerant out of the cooling system 2. The cooling system 2 includes a pipe 21, a tank 22, a radiator 23, a pump 24, a cooling fan 25, and a cooling apparatus 3A.

The pipe 21 is a tubular member configured to allow the liquid refrigerant to flow therein, and couples the tank 22, the radiator 23, the pump 24, and the cooling apparatus 3A to each other in a ring shape. The pipe 21 includes a first pipe 211, a second pipe 212, a third pipe 213, and a fourth pipe 214.

The first pipe 211 couples the cooling apparatus 3A and the tank 22 to each other.

The second pipe 212 couples the tank 22 and the radiator 23 to each other.

The third pipe 213 couples the radiator 23 and the pump 24 to each other.

The fourth pipe 214 couples the pump 24 and the cooling apparatus 3A to each other.

The tank 22 is coupled to the cooling apparatus 3A via the first pipe 211 and to the radiator 23 via the second pipe 212. The tank 22 stores the liquid refrigerant that circulates in the cooling system 2. In the present embodiment, the tank 22 stores the liquid refrigerant discharged from the cooling apparatus 3A.

The radiator 23 is coupled to the tank 22 via the second pipe 212 and to the pump 24 via the third pipe 213. The radiator 23 cools the liquid refrigerant caused by the driven pump 24 to flow from the tank 22 via the second pipe 212. In detail, the radiator 23 cools the liquid refrigerant by receiving the heat from the liquid refrigerant flowing from the tank 22 and transferring the received heat to a cooling gas caused to flow by the cooling fan 25.

The pump 24 is coupled to the radiator 23 via the third pipe 213 and to the cooling apparatus 3A via the fourth pipe 214. The pump 24 delivers the liquid refrigerant cooled by the radiator 23 to the cooling apparatus 3A.

Configuration of Cooling Apparatus

Figure 2:
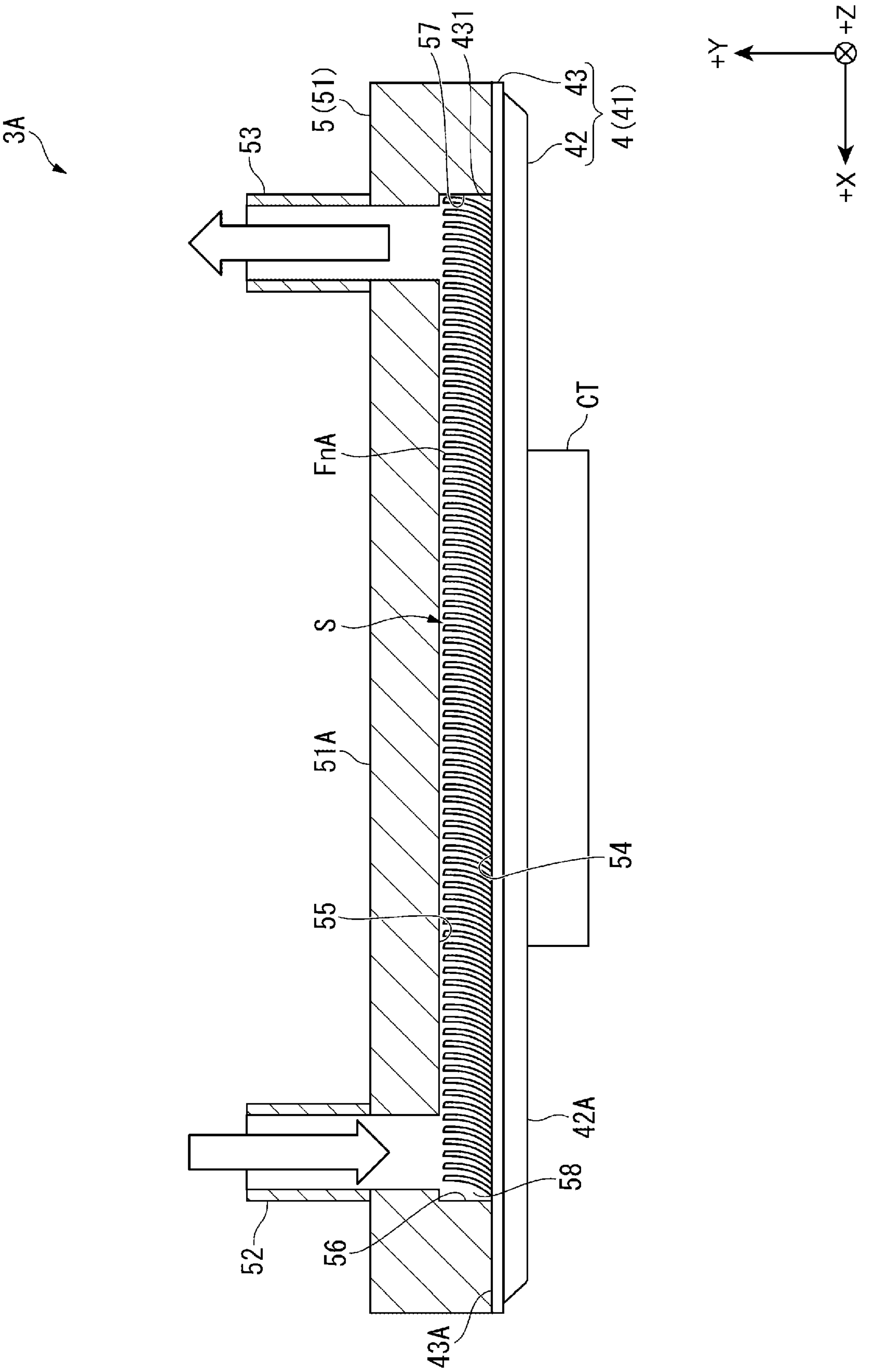
FIG. 2 shows a cooling apparatus according to the first embodiment.

FIG. 2 shows the cooling apparatus 3A. In FIG. 2, a liquid cooling section 5, which constitutes the cooling apparatus 3A, is shown in the form of a cross section. In FIG. 2, some of a plurality of first fins FnA have reference characters.

The cooling apparatus 3A is coupled to the pump 24 via the fourth pipe 214 and to the tank 22 via the first pipe 211. The cooling apparatus 3A cools the cooling target CT by transferring the heat received from the cooling target CT to the liquid refrigerant.

The cooling apparatus 3A includes a first vapor chamber 4, the liquid cooling section 5, and the plurality of first fins FnA, as shown in FIG. 2.

In the following description, three directions perpendicular to one another are called directions X, Y, and Z toward the positive end thereof. Out of the three axes, the direction Y toward the positive end thereof is the direction from the cooling target CT to the first vapor chamber 4. In the view employed to draw FIG. 2, the direction Y toward the positive end thereof is the upward direction. It is assumed in the view employed to draw FIG. 2 that the direction X toward the positive end thereof is the leftward direction, and that the direction Z toward the positive end thereof is the direction toward the plane of view. The direction X toward the positive end thereof corresponds to a first direction and is the direction in which the plurality of first fins FnA are arranged. Furthermore, the opposite direction of the direction X toward the positive end thereof is called a direction X toward the negative end thereof, the opposite direction of the direction Y toward the positive end thereof is called a direction Y toward the negative end thereof, and the opposite direction of the direction Z toward the positive end thereof is a direction Z toward the negative end thereof. In the view employed to draw FIG. 2, the direction X toward the negative end thereof is the rightward direction, the direction Y toward the negative end thereof is the downward direction, and the direction Z toward the negative end thereof is the direction away from the plane of view.

Configuration of First Vapor Chamber

Figure 3:
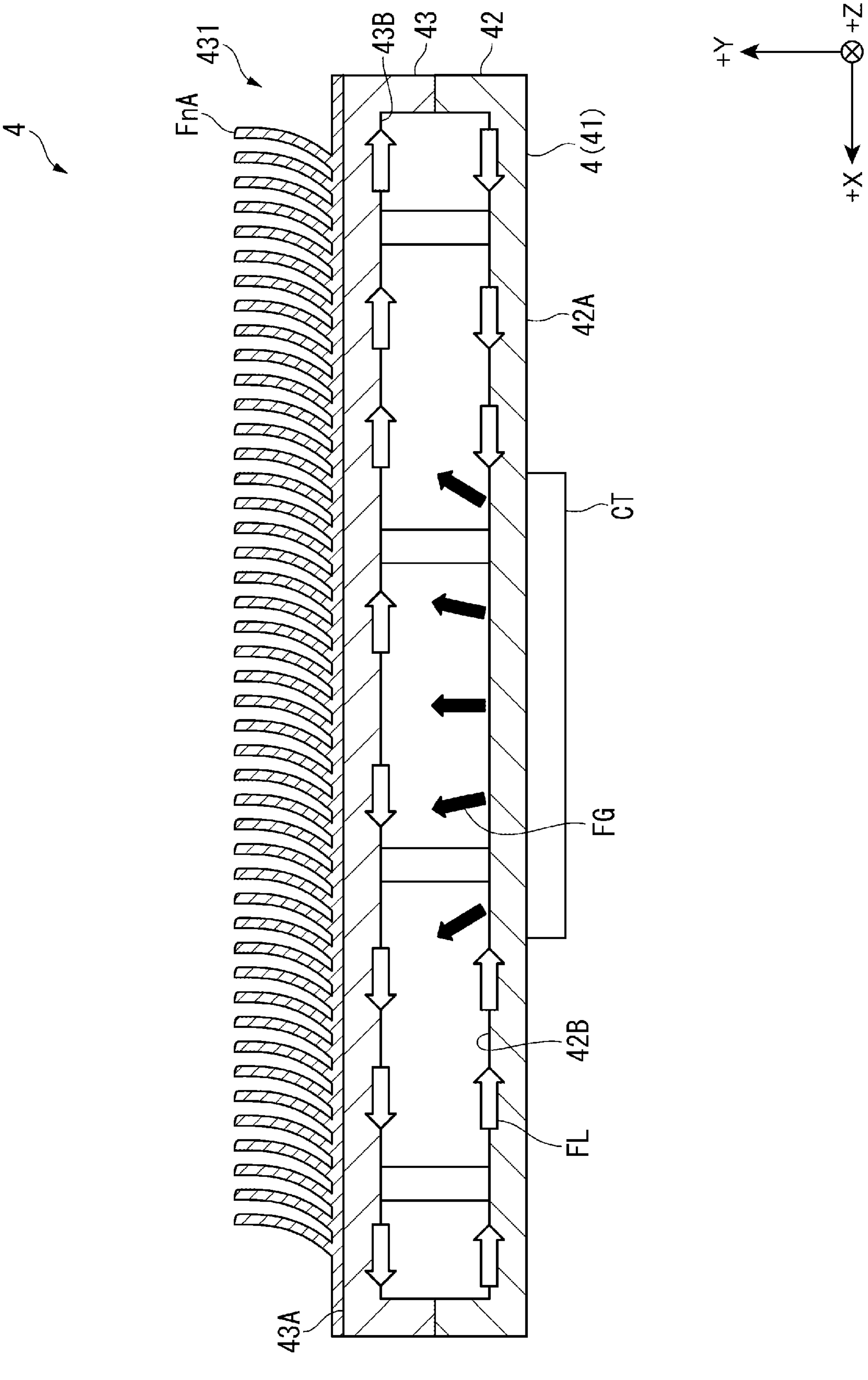
FIG. 3 is a diagrammatic view showing the configuration of a first vapor chamber according to the first embodiment.

FIG. 3 is a diagrammatic view of the first vapor chamber 4 and shows the cross section of the first vapor chamber 4 taken along the plane XY. In FIG. 3, a part of a liquid-phase working fluid is indicated by white arrows FL, and a part of a gas-phase working fluid is indicated by black arrows FG. In FIG. 3, some of a plurality of first fins FnA have reference characters.

The first vapor chamber 4 is formed in the shape of a planar plate extending along the plane XZ, is coupled to the cooling target CT, which is a heat source, and receives the heat from the cooling target CT. The first vapor chamber 4 includes a first sealed container 41, which is a combination of a first plate 42 and a second plate 43 and which encapsulates the working fluid, which is a first working fluid.

The first plate 42 is disposed along the plane XZ and shifted from the second plate 43 toward the negative end of the direction Y. The first plate 42 has an outer surface 42A and an inner surface 42B.

The outer surface 42A of the first plate 42 is the surface opposite from the second plate 43. The outer surface 42A constitutes a part of the outer surface of the first sealed container 41. The cooling target CT is coupled in a heat-transferable manner to a part of the outer surface 42A. That is, the first plate 42 is coupled to the cooling target CT, which is the heat source, in a heat-transferable manner.

The inner surface 42B of the first plate 42 is opposite from the outer surface 42A thereof and faces the second plate 43. The inner surface 42B constitutes a part of the inner surface of the first sealed container 41. The inner surface 42B is provided with, although not shown, a mesh that holds the liquid-phase working fluid.

The second plate 43 is disposed along the plane XZ and shifted from the first plate 42 toward the positive end of the direction Y. The second plate 43 dissipates the heat of the cooling target CT received via the first plate 42. The second plate 43 has an outer surface 43A and an inner surface 43B.

The inner surface 43B of the second plate 43 is opposite from the inner surface 42B of the first plate 42. The inner surface 43B constitutes a part of the inner surface of the first sealed container 41. That is, the inner surface 43B is the inner surface corresponding to the outer surface 43A in the first sealed container 41.

The outer surface 43A of the second plate 43 is the surface opposite from the first plate 42. The outer surface 43A constitutes a part of the outer surface of the first sealed container 41. The outer surface 43A forms a first inner surface 54 of the liquid cooling section 5 when the first vapor chamber 4 and a liquid cooling container 51 of the liquid cooling section 5 are combined with each other, as shown in FIG. 2. That is, the second plate 43 has a first inner surface constituting region 431, which is provided at the outer surface 43A and constitutes the first inner surface 54.

The plurality of first fins FnA, which will be described later, are disposed in the first inner surface constituting region 431.

In the first vapor chamber 4, the heat received from the cooling target CT via the outer surface 42A vaporizes the liquid-phase working fluid at the inner surface 42B to change the liquid-phase working fluid to the gas-phase working fluid, as shown in FIG. 3. The gas-phase working fluid diffuses in the first sealed container 41, and part of the gas-phase working fluid reaches the inner surface 43B and condenses by transferring the heat to the inner surface 43B. That is, part of the gas-phase working fluid is changed to the liquid-phase working fluid at the inner surface 43B. The heat transferred to the inner surface 43B is transferred to the outer surface 43A and dissipated. The cooling target CT is thus deprived of the heat and therefore cooled. The liquid-phase working fluid into which the gas-phase working fluid has condensed is transported by the mesh provided at the inner surface of the first sealed container 41 to a position corresponding to the cooling target CT, which is the heat source, at the inner surface 42B of the first plate 42.

Configuration of Liquid Cooling Section

The liquid cooling section 5 includes the liquid cooling container 51, which is combined with the first vapor chamber 4, as shown in FIG. 2, and the liquid refrigerant delivered from the pump 24 flows along the first vapor chamber.

The liquid cooling container 51, when combined with the first vapor chamber 4, forms a flow space in which the liquid refrigerant can flow. The liquid cooling container 51 has an introduction port 52 and a discharge port 53.

The introduction port 52 is coupled to the fourth pipe 214 shown in FIG. 1 and introduces the liquid refrigerant delivered from the pump 24 into the liquid cooling container 51. The introduction port 52 communicates with the flow space S, and the liquid refrigerant introduced into the liquid cooling container 51 via the introduction port 52 flows into the flow space S.

The discharge port 53 is coupled to the first pipe 211 shown in FIG. 1 and discharges the liquid refrigerant having flowed in the flow space S in the liquid cooling container 51. The discharged liquid refrigerant flows into the tank 22 through the first pipe 211.

Figure 4:
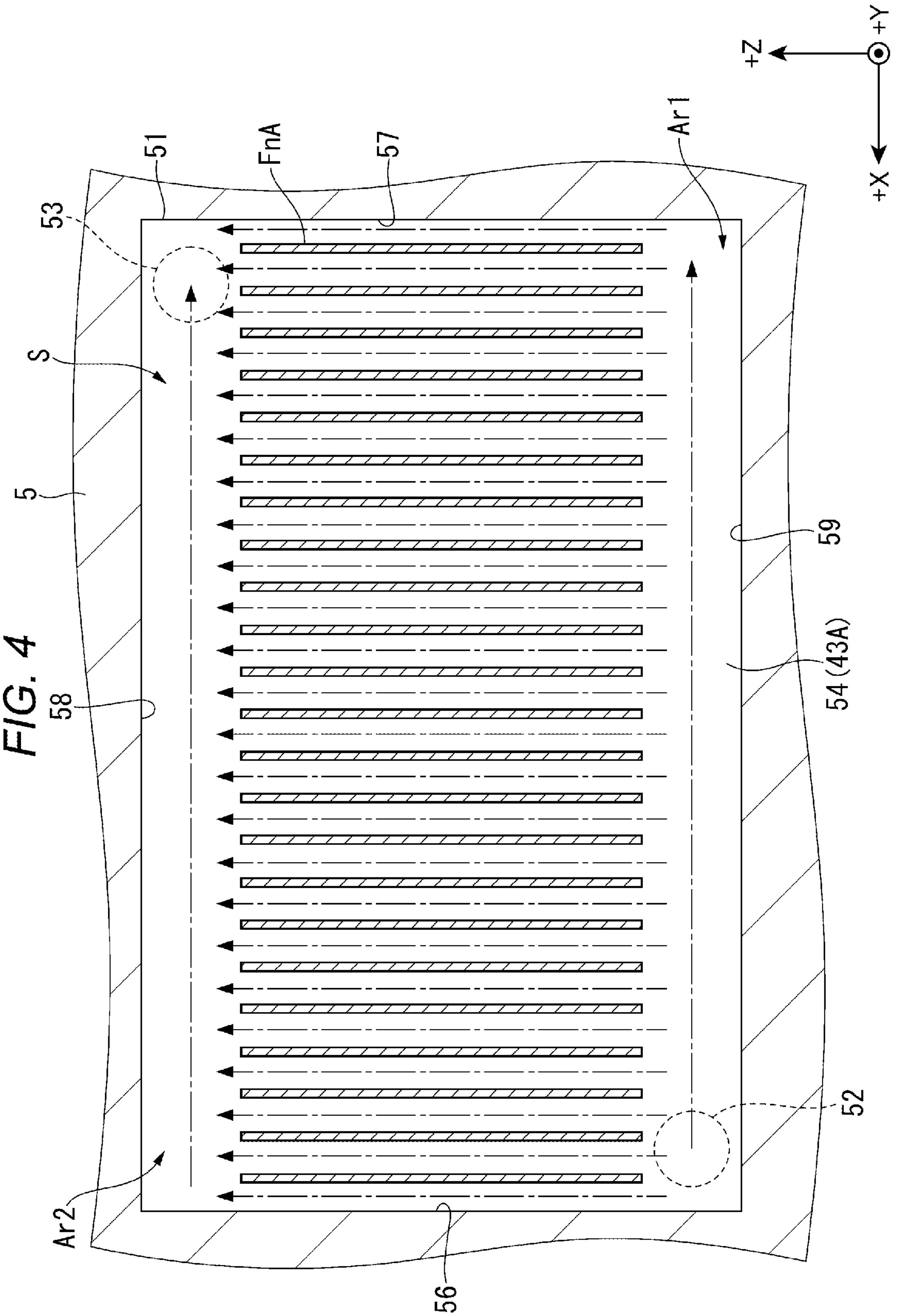
FIG. 4 shows the interior of a liquid cooling section according to the first embodiment.

FIG. 4 shows the interior of the liquid cooling section 5 viewed from the positive end of the direction Y. In FIG. 4, some of a plurality of first fins FnA have reference characters.

When the thus configured liquid cooling container 51 is combined with the first vapor chamber 4, the liquid cooling section 5 forms the flow space S surrounded by inner surfaces 54 to 59, as shown in FIGS. 2 and 4. That is, the liquid cooling section 5 has the first inner surface 54, a second inner surface 55, a third inner surface 56, a fourth inner surface 57, a fifth inner surface 58, and a sixth inner surface 59, which form the flow space S.

Out of the inner surfaces of the liquid cooling section 5, the first inner surface 54 is the inner surface facing the positive end of the direction Y. At least a part of the first inner surface 54 is formed of the first inner surface constituting region 431 at the outer surface 43A. Since the plurality of first fins FnA are provided in the first inner surface constituting region 431, the plurality of first fins FnA are disposed in the flow space S, in which the liquid refrigerant flows.

Out of the inner surfaces of the liquid cooling section 5, the second inner surface 55 is the inner surface facing the negative end of the direction Y and faces the first inner surface 54. The second inner surface 55 is coupled to the introduction port 52 and the discharge port 53. That is, an outer surface 51A of the liquid cooled container 51, which is opposite from the second inner surface 55, is provided with the introduction port 52 and the discharge port 53. At the outer surface 51A, the position of the introduction port 52 is shifted from the position of the discharge port 53 toward the positive end of the direction X and the negative end of the direction Z, as shown in FIGS. 2 and 4. At the outer surface 51A, the position of the discharge port 53 is shifted from the position of the introduction port 52 toward the negative end of the direction X and the positive end of the direction Z.

Out of the inner surfaces of the liquid cooling section 5, the third inner surface 56 is the inner surface facing the negative end of the direction X.

Out of the inner surfaces of the liquid cooling section 5, the fourth inner surface 57 is the inner surface facing the positive end of the direction X and faces the third inner surface 56.

Out of the inner surfaces of the liquid cooling section 5, the fifth inner surface 58 is the inner surface facing the negative end of the direction Z.

Out of the inner surfaces of the liquid cooling section 5, the sixth inner surface 59 is the inner surface facing the positive end of the direction Z and faces the fifth inner surface 58.

Configuration of Plurality of First Fins

The plurality of first fins FnA protrude toward the positive end of the direction Y from the first inner surface constituting region 431 at the outer surface 43A, and are disposed in the flow space S when the first vapor chamber 4 and the liquid cooling container 51 are combined with each other, as shown in FIGS. 2 and 3. It can also be said that the first vapor chamber 4 includes the plurality of first fins FnA disposed in the first inner surface constituting region 431.

The plurality of first fins FnA each rise to form an arcuate shape toward the negative end of the direction X as the first fin FnA rises from the outer surface 43A toward the positive end of the direction Y, and then extend in parallel to the direction Y toward the positive end thereof.

The plurality of first fins FnA extend from the side facing the sixth inner surface 59 toward the negative end of the direction Z, and are arranged in the direction X toward the positive end thereof, that is, in the first direction at predetermined intervals, as shown in FIG. 4. The plurality of first fins FnA therefore form a part of the channel of the liquid refrigerant introduced into the liquid cooling section 5 via the introduction port 52 and flowing toward the positive end of the direction Z.

Liquid Refrigerant Flowing in Liquid Cooling Section

The liquid refrigerant introduced into the liquid cooling section 5 via the introduction port 52 flows to a region Ar1, which is shifted toward the negative end of the direction Z from the plurality of first fins FnA, in the flow space S. The liquid refrigerant then flows toward the positive end of the direction Z along the first vapor chamber 4 from region Ar1 through the channels provided between the first fins FnA. The heat of the cooling target CT transferred to the second plate 43 via the first plate 42 with the aid of the change of the working fluid in the first vapor chamber 4 from the gas phase to the liquid phase and vice versa is thus transferred from the first fins FnA to the liquid refrigerant.

The liquid refrigerant having flowed toward the positive end of the direction Z along the channels between the first fins FnA is discharged into the first pipe 211 via the discharge port 53 from a region Ar2, which is shifted toward the positive end of the direction Z from the plurality of first fins FnA, in the flow space S. The liquid refrigerant having flowed into the tank 22 via the first pipe 211 is cooled by the radiator 23 and caused to flow again by the pump 24 to the introduction port 52.

As the liquid refrigerant circulates through the cooling system 2, the heat of the cooling target CT transferred to the first vapor chamber 4 is efficiently transferred to the liquid refrigerant, and the target CT is in turn cooled.

Effects of First Embodiment

The electronic instrument 1 according to the present embodiment described above provides the following effects.

The electronic instrument 1 includes the cooling target CT, which is the heat source, and the circulation-type cooling system 2.

The circulation-type cooling system 2 includes the radiator 23, the pump 24, and the cooling apparatus 3A. The radiator 23 cools the liquid refrigerant discharged via the discharge port 53 of the cooling apparatus 3A. The pump 24 causes the liquid refrigerant to flow to the introduction port 52 of the cooling apparatus 3A.

The cooling apparatus 3A includes the first vapor chamber 4, the liquid cooling section 5, and the plurality of first fins FnA.

The first vapor chamber 4 includes the first sealed container 41. The first sealed container 41 is the combination of the first plate 42, which receives the heat from the cooling target CT, which is the heat source, and the second plate 43, which faces the first plate 42. In the first sealed container 41, the working fluid encapsulated therein vaporizes and condenses. The working fluid is also the first working fluid.

The liquid cooling section 5 includes the liquid cooling container 51, which is combined with the first vapor chamber 4. In the liquid cooling section 5, the liquid refrigerant flowing therein flows along the first vapor chamber 4. The liquid cooling section 5 has the introduction port 52 and the discharge port 53. The introduction port 52 introduces the liquid refrigerant from the region outside the liquid cooling section 5 into the liquid cooling section 5. The discharge port 53 discharges the liquid refrigerant having flowed in the liquid cooling section 5 to the region outside the liquid cooling section 5.

The second plate 43 has the first inner surface constituting region 431, which is located at the outer surface 43A of the second plate 43 and forms at least a part of the first inner surface 54 of the liquid cooling section 5.

The plurality of first fins FnA are provided in the liquid cooling section 5. The plurality of first fins FnA form a part of the channels of the liquid refrigerant. The plurality of first fins FnA are disposed in the first inner surface constituting region 431.

According to the configuration described above, the heat of the cooling target CT received at the first plate 42 vaporizes the working fluid encapsulated in the first sealed container 41. The gas-phase working fluid diffuses in the first sealed container 41. The heat of the gas-phase working fluid is transferred to the second plate 43, so that the gas-phase working fluid condenses into the liquid-phase working fluid at the second plate 43. The heat of the cooling target CT is thus transferred over a wide range at the second plate 43.

The heat transferred to the second plate 43 is transferred to the plurality of first fins FnA disposed in the first inner surface constituting region 431 at the second plate 43 and therefore disposed in the liquid cooling section 5. The liquid refrigerant introduced via the introduction port 52 flows in the liquid cooling section 5, and the liquid refrigerant flows along the channels formed by the plurality of first fins FnA. The heat transferred to the plurality of first fins FnA is thus transferred to the liquid refrigerant. The liquid refrigerant to which the heat has been transferred is then discharged to the region outside the liquid cooling section 5 via the discharge port 53.

The heat of the cooling target CT received by the first vapor chamber 4 can thus be efficiently transferred to the liquid refrigerant flowing in the liquid cooling section 5 with the aid of the plurality of first fins FnA. That is, the heat of the cooling target CT can be transferred to the liquid refrigerant more efficiently than in a case where the plurality of first fins FnA are not provided.

Furthermore, since the liquid refrigerant cooled by the radiator 23 flows in the liquid cooling section 5, the efficiency of the heat transfer to the liquid refrigerant in the liquid cooling section 5 can be increased.

The efficiency at which the cooling apparatus 3A cools the cooling target CT can therefore be increased.

Second Embodiment

A second embodiment of the present disclosure will next be described.

The electronic instrument according to the present embodiment has the same configuration as that of the electronic instrument 1 according to the first embodiment but differs therefrom in terms of the configuration of the cooling apparatus. In the following description, portions that are the same or substantially the same as the portions having been already described have the same reference characters and will not be described.

Configuration of Electronic Instrument and Circulation-Type Cooling System

Figure 5:
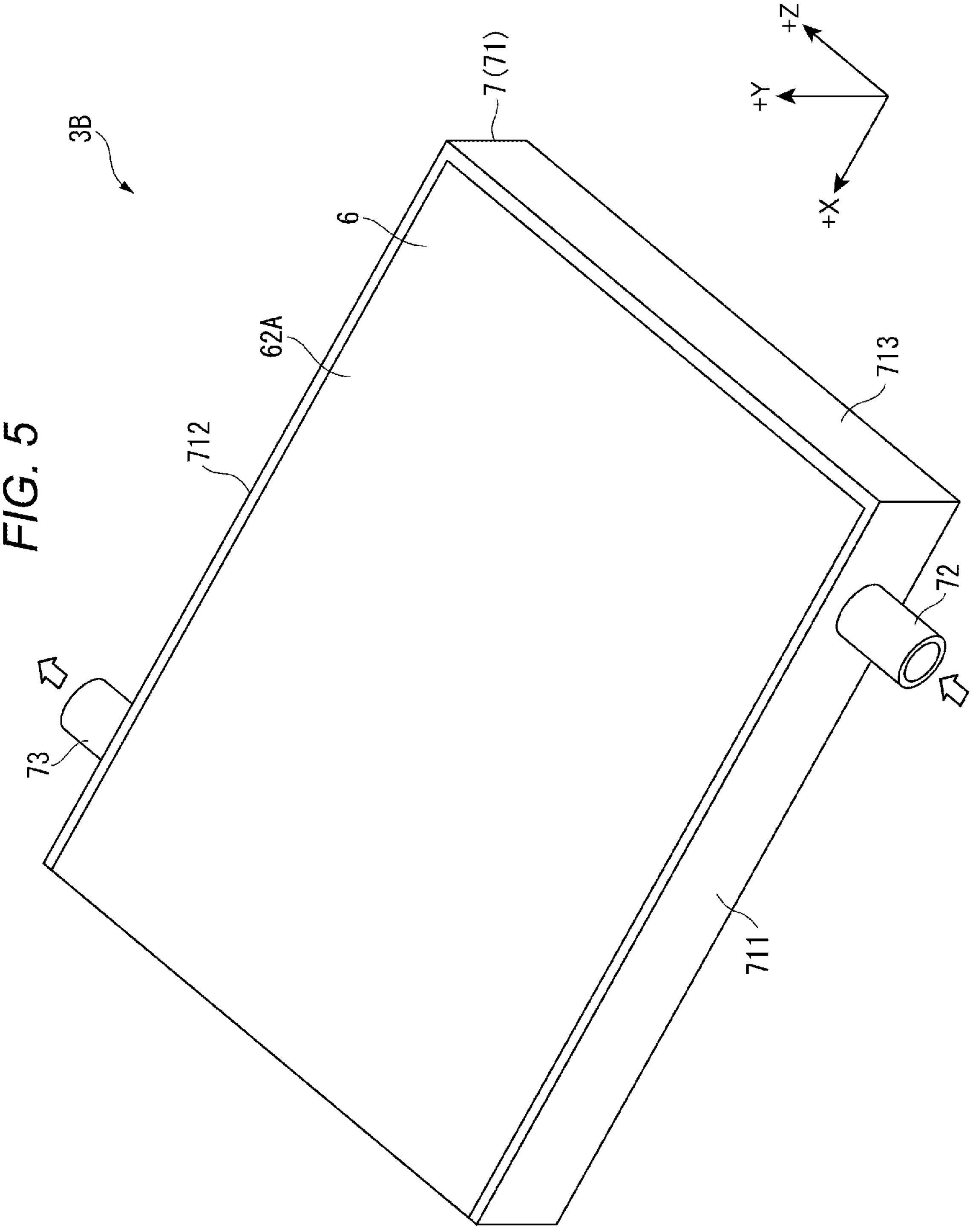
FIG. 5 is a perspective view showing the cooling apparatus according to a second embodiment.
Figure 6:
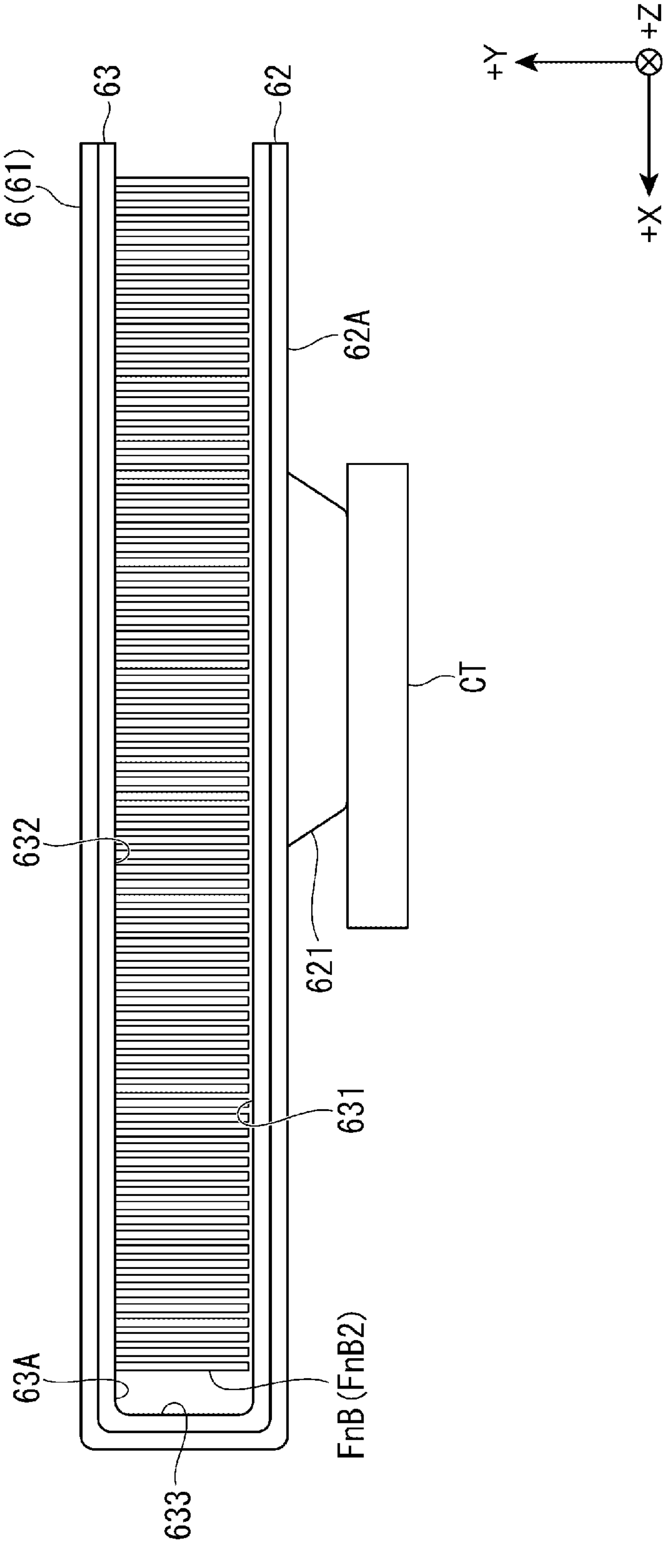
FIG. 6 is a side view of the first vapor chamber according to the second embodiment.
Figure 7:
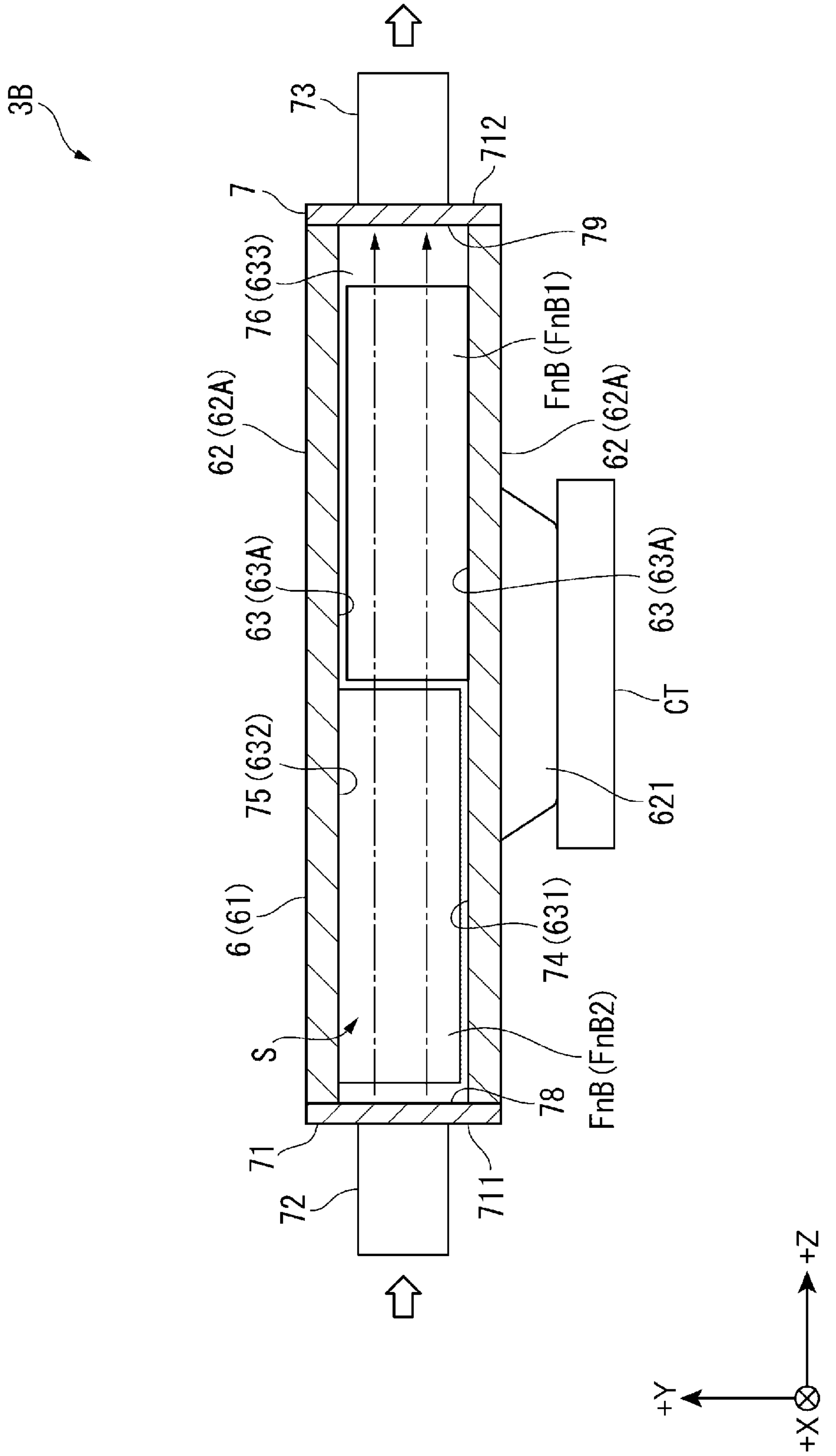
FIG. 7 shows a cross section of the cooling apparatus according to the second embodiment.

FIG. 5 is a perspective view showing a cooling apparatus 3B according to the present embodiment. FIG. 6 is a side view of a first vapor chamber 6, which constitutes the cooling apparatus 3B, viewed from a position shifted from the first vapor chamber 6 toward the negative end of the direction Z. FIG. 7 shows the cross section of the cooling apparatus 3B taken along the plane YZ and viewed from the negative end of the direction X. In FIG. 6, some of a plurality of second fins FnB2 have reference characters.

The electronic instrument according to the present embodiment has the same configuration and function as those of the electronic instrument 1 according to the first embodiment except that the cooling apparatus 3A is replaced with the cooling apparatus 3B shown in FIGS. 5 to 7. That is, the circulation-type cooling system 2 with which the electronic instrument according to the present embodiment is provided has the same configuration and function as the circulation-type cooling system 2 according to the first embodiment except that the cooling apparatus 3A is replaced with the cooling apparatus 3B.

The cooling apparatus 3B cools the cooling target CT by transferring the heat received from the cooling target CT to the liquid refrigerant circulating through the cooling system 2, as the cooling apparatus 3A does.

The cooling apparatus 3B includes the first vapor chamber 6 and a liquid cooling section 7, as shown in FIGS. 5 to 7, and further includes a plurality of fins FnB, as shown in FIGS. 6 and 7.

Configuration of First Vapor Chamber

The first vapor chamber 6 is coupled to the cooling target CT in a heat-transferable manner and transfers the heat received from the cooling target CT to the liquid refrigerant, as in the first vapor chamber 4 according to the first embodiment. The first vapor chamber 6 is formed in a folded shape in which a part of a first plate 62 and a part of a second plate 63, which will be described later, face each other in the direction Y toward the positive or negative end thereof, as shown in FIG. 6. That is, the first vapor chamber 6 is formed substantially in the shape of the horizontally orientated letter U when viewed from the negative end of the direction Z. The state in which the first vapor chamber 6 is formed substantially in the shape of the letter U includes a state in which a portion of the first plate 62 and a portion of the second plate 63 of the first vapor chamber 6 face each other.

The first vapor chamber 6 includes a first sealed container 61, which is a combination of the first plate 62 and the second plate 63 and encapsulates a working fluid having a phase changeable between the gas phase and the liquid phase. The working fluid encapsulated in the first sealed container 61 is also the first working fluid.

The first plate 62 is formed substantially in the shape of the horizontally orientated letter U when viewed from a position shifted from the first plate 62 toward the negative end of the direction Z, and a part of the first plate 62 shifted toward the negative end of the direction Y from the space in which the fins FnB are disposed in the first plate 62 faces a part of the first plate 62 shifted from the space toward the positive end of the direction Y. The first plate 62 has an outer surface 62A and an inner surface that is not shown.

The outer surface 62A is a surface of the first plate 62 that faces outward and constitutes a part of the outer surface of the first sealed container 61. Out of the outer surface 62A, the portion facing the negative end of the direction Y is provided with a protrusion 621, which protrudes toward the negative end of the direction Y, and the cooling target CT is coupled to the surface of the protrusion 621 that faces the negative end of the direction Y in a heat-transferable manner. That is, the surface of the protrusion 621 that faces the negative end of the direction Y receives the heat from the cooling target CT. The protrusion 621 may be omitted. In this case, the cooling target CT may be directly coupled to the outer surface 62A.

The inner surface of the first plate 62 is the surface facing inward or toward the space where the fins FnB are disposed in the first plate 62, and constitutes the inner surface of the first sealed container 61. Out of the inner surface of the first plate 62, the portion facing the positive end of the direction Y and the portion facing the negative end of the direction Y face each other. The inner surface of the first plate 62 is provided, although not shown, with a mesh that holds the liquid-phase working fluid out of the working fluid encapsulated in the first sealed container 61.

The second plate 63 is formed substantially in the shape of the horizontally orientated letter U when viewed from a position shifted from the second plate 63 toward the negative end of the direction Z, and a part of the second plate 63 shifted toward the negative end of the direction Y from the space in which the fins FnB are disposed in the second plate 63 faces a part of the second plate 63 shifted from the space toward the positive end of the direction Y, as the first plate 62 is. The second plate 63 has an outer surface 63A and an inner surface that is not shown.

The inner surface of the second plate 63 is the surface facing outward from the space where the fins FnB are disposed in the second plate 63, and constitutes the inner surface of the first sealed container 61. That is, the inner surface of the second plate 63 faces the inner surface of the first plate 62. The inner surface of the second plate 63 receives the heat from the gas-phase working fluid and causes the gas-phase working fluid to condense into the liquid-phase working fluid.

The outer surface 63A is the surface facing inward or toward the space where the fins FnB are disposed in the second plate 63. The outer surface 63A is a heat dissipating surface via which the heat received from the gas-phase working fluid is dissipated, and the plurality of fins FnB, which will be described later, are disposed at a part of the outer surface 63A.

The outer surface 63A constitutes outer surfaces of the first sealed container 61 that face each other. The outer surface 63A forms a first inner surface 74, a second inner surface 75, and a third inner surface 76 of the liquid cooling section 7 when the first vapor chamber 6 and a liquid cooling container 71 of the liquid cooling section 7 are combined with each other.

That is, in FIG. 6, the second plate 63 has a first inner surface constituting region 631, which faces the positive end of the direction Y and constitutes at least a part of the first inner surface 74 at the outer surface 63A, a second inner surface constituting region 632, which faces the negative end of the direction Y and constitutes at least a part of the second inner surface 75 at the outer surface 63A, and a third inner surface constituting region 633, which faces the negative end of the direction X and constitutes at least a part of the third inner surface 76, which is shown in FIG. 7, at the outer surface 63A. The first inner surface constituting region 631 and the second inner surface constituting region 632 face each other in the direction Y toward the positive or negative end thereof.

Configuration of Liquid Cooling Section

The liquid cooling section 7 is combined with the first vapor chamber 6 and transfers the heat dissipated from the first vapor chamber 6 to the liquid refrigerant flowing in the liquid cooling section 7, as in the liquid cooling section 5. The liquid cooling section 7 includes the liquid cooling container 71, which is combined with the first vapor chamber 6, as shown in FIG. 5.

The liquid cooling container 71 is configured as a frame that surrounds the sides of that face the negative end of the direction X, the positive end of the direction Z, and the negative end of the direction Z of the first vapor chamber 6, and is combined with the first vapor chamber 6, as shown in FIG. 5. The liquid cooling container 71 has wall sections 711 to 713, which surround the first vapor chamber 6, an introduction port 72, and a discharge port 73.

The wall sections 711 and 712 sandwich the first vapor chamber 6 between the sides facing the positive and negative ends of the direction Z. The wall section 711 disposed at the side facing the negative end of the direction Z is provided with the introduction port 72, which is coupled to the fourth pipe 214. The wall section 712 disposed at the side facing the positive end of the direction Z is provided with the discharge port 73, which is coupled to the first pipe 211.

The wall section 713 is provided at a position shifted from the first vapor chamber 6 toward the negative end of the direction X. The inner surface of wall section 713 faces the third inner surface constituting region 633 and constitutes a channel of the liquid refrigerant flowing toward the positive end of the direction Z.

The introduction port 72 introduces the liquid refrigerant flowing from the pump 24 through the fourth pipe 214 into the liquid cooling container 71.

The discharge port 73 discharges the liquid refrigerant having flowed in the liquid cooling container 71 to the tank 22 through the first pipe 211.

When the thus configured liquid cooling container 71 is combined with the first vapor chamber 6, the flow space S, in which the liquid refrigerant can flow, is formed in the liquid cooling section 7, as shown in FIG. 7.

That is, the liquid cooling section 7 has the first inner surface 74, the second inner surface 75, the third inner surface 76, a fourth inner surface that is not shown, a fifth inner surface 78, and a sixth inner surface 79, which form the flow space S.

Out of the inner surfaces of the liquid cooling section 7, the first inner surface 74 is the inner surface facing the positive end of the direction Y. At least a part of the first inner surface 74 is formed of the first inner surface constituting region 631 at the second plate 63.

Out of the inner surfaces of the liquid cooling section 7, the second inner surface 75 is the inner surface facing the negative end of the direction Y and faces the first inner surface 74. At least a part of the second inner surface 75 is formed of the second inner surface constituting region 632 at the second plate 63.

Out of the inner surfaces of the liquid cooling section 7, the third inner surface 76 is the inner surface facing the negative end of the direction X. The third inner surface 76 is formed of the third inner surface constituting region 633 at the second plate 63.

Out of the inner surfaces of the liquid cooling section 7, the fourth inner surface, which is not shown is the inner surface facing the positive end of the direction X and faces the third inner surface 76. The fourth inner surface is the inner surface of the wall section 713 shown in FIG. 5.

Out of the inner surfaces of the liquid cooling section 7, the fifth inner surface 78 is the inner surface facing the positive end of the direction Z and is also the inner surface of the wall section 711.

Out of the inner surfaces of the liquid cooling section 7, the sixth inner surface 79 is the inner surface facing the negative end of the direction Z and is also the inner surface of the wall section 712. The sixth inner surface 79 faces the fifth inner surface 78.

The plurality of fins FnB disposed at the outer surface 63A of the second plate 63 are disposed in the thus configured flow space S.

Configuration of Plurality of Fins

The plurality of fins FnB are disposed at the outer surface 63A of the first vapor chamber 6, as shown in FIG. 7. The plurality of fins FnB include a plurality of first fins FnB1 disposed in the first inner surface constituting region 631 and a plurality of second fins FnB2 disposed in the second inner surface constituting region 632.

The plurality of first fins FnB1 each rise from the first inner surface constituting region 631 toward the positive end of the direction Y. That is, the plurality of first fins FnB1 are disposed at the first inner surface 74. The plurality of first fins FnB1 extend along the direction Z toward the positive end thereof and are arranged, although not shown in detail, in the direction X toward the positive end thereof, which is the first direction. The plurality of first fins FnB1 form a part of the channel of the liquid refrigerant flowing in the liquid cooling section 7.

The plurality of first fins FnB1 are not disposed substantially across the entire first inner surface constituting region 631, but in a region facing the discharge port 73 in the first inner surface constituting region 631. That is, the plurality of first fins FnB1 are disposed in a region at the downstream side in the liquid refrigerant channel in the first inner surface constituting region 631. The region at the downstream side is also called a downstream region. In other words, the plurality of first fins FnB1 are disposed in the region facing the positive end of the direction Z in the first inner surface constituting region 631.

The plurality of second fins FnB2 each rise from the second inner surface constituting region 632 toward the positive end of the direction Y. That is, the plurality of second fins FnB2 are disposed at the second inner surface 75. The plurality of second fins FnB2 extend along the direction Z toward the positive end thereof and are arranged, although not shown, in the direction X toward the positive end thereof. The plurality of second fins FnB2 form a part of the channel of the liquid refrigerant flowing in the liquid cooling section 7.

The plurality of second fins FnB2 are not disposed substantially across the entire second inner surface constituting region 632, but in a region facing the introduction port 72 in the second inner surface constituting region 632. That is, the plurality of second fins FnB2 are disposed in a region at the upstream side in the liquid refrigerant channel in the second inner surface constituting region 632. The region at the upstream side is also called an upstream region. In other words, the plurality of second fins FnB2 are disposed in the region facing the negative end of the direction Z in the second inner surface constituting region 632.

In the present embodiment, the first fins FnB1 have the same dimension in the directions X, Y, and Z toward the positive ends thereof. The second fins FnB2 have the same dimension in the directions X, Y, and Z toward the positive ends thereof.

The first fins FnB1 and the second fins FnB2 have the same dimension in the direction X toward the positive end thereof. The first fins FnB1 and the second fins FnB2 have the same dimension in the direction Y toward the positive end thereof. The first fins FnB1 and the second fins FnB2 have the same dimension in the direction Z toward the positive end thereof. Furthermore, the plurality of first fins FnB1 and the plurality of second fins FnB2 are arranged at the same intervals in the direction X toward the positive end thereof.

The tip of each of the first fins FnB1 that faces the positive end of the direction Y may or may not be in contact with the second inner surface constituting region 632. Similarly, the tip of each of the second fins FnB2 that faces the negative end of the direction Y may or may not be in contact with the first inner surface constituting region 631.

Cooling of Cooling Target Performed by Cooling Apparatus

The first vapor chamber 6 receives the heat of the cooling target CT at the outer surface 62A. In the first vapor chamber 6, the heat received from the cooling target CT vaporizes the liquid-phase working fluid held in the mesh, and the gas-phase working fluid diffuses in the first vapor chamber 6. Part of the gas-phase working fluid condenses into the liquid-phase working fluid by transferring the heat to the inner surface corresponding to the first inner surface constituting region 631, and the other part of the gas-phase working fluid condenses into the liquid-phase working fluid by transferring the heat to the inner surface corresponding to the second inner surface constituting region 632. The liquid-phase working fluid travels through the mesh and reaches the inner surface corresponding to the cooling target CT.

Part of the heat transferred to the inner surface corresponding to the first inner surface constituting region 631 is transferred to the plurality of first fins FnB1 disposed in the first inner surface constituting region 631, and the other part of the heat is transferred to the region where the first fins FnB1 are not disposed in the first inner surface constituting region 631. Part of the heat transferred to the inner surface corresponding to the second inner surface constituting region 632 is transferred to the plurality of second fins FnB2 disposed in the second inner surface constituting region 632, and the other part of the heat is transferred to the region where the second fins FnB2 are not disposed in the second inner surface constituting region 632.

The liquid refrigerant introduced into the liquid cooling section 7 via the introduction port 72 flows toward the positive end of the direction Z along the channel between the plurality of second fins FnB2, which are disposed upstream from the plurality of first fins FnB1. Note that the temperature of the base portion of each of the second fins FnB2 is higher than the temperature of the tip portion thereof. That is, the temperature of the portion of each of the second fins FnB2 that faces the positive end of the direction Y is higher than the temperature of the portion that faces the negative end of the direction Y. Therefore, out of the liquid refrigerant flowing toward the positive end of the direction Z in the space between the first inner surface 74 and the second inner surface 75, the heat is readily transferred from the second fins FnB2 to the liquid refrigerant flowing along the side facing the second inner surface 75, so that the temperature of the liquid refrigerant flowing along the side facing the second inner surface 75 is higher than the temperature of the liquid refrigerant flowing along the side facing the first inner surface 74.

The liquid refrigerant having flowed between the second fin FnB2 flows toward the positive end of the direction Z along the channels between the plurality of first fins FnB1. Note that the temperature of the base portion of each of the first fins FnB1 is higher than the temperature of the tip portion thereof. That is, the temperature of the portion of each of the first fins FnB1 that faces the negative end of the direction Y is higher than the temperature of the portion that faces the positive end of the direction Y. Therefore, out of the liquid refrigerant flowing toward the positive end of the direction Z in the space between the first inner surface 74 and the second inner surface 75, the heat is readily transferred from the first fins FnB1 to the liquid refrigerant flowing along the side facing the first inner surface 74, so that the temperature of the liquid refrigerant flowing along the side facing the first inner surface 74 is higher than the temperature of the liquid refrigerant flowing along the side facing the second inner surface 75.

The temperature difference is thus so mitigated that the temperature of the liquid refrigerant flowing between the second fins FnB2 and then flowing between the first fins FnB1 is homogenized between the first inner surface 74 and the second inner surface 75. The heat from each of the fins FnB is thus readily transferred to the liquid refrigerant, whereby the efficiency at which the fins FnB are each cooled can be increased, and the efficiency at which the cooling target CT is cooled can in turn be increased.

The liquid refrigerant having flowed between the first fins FnB1 is discharged via the discharge port 73 into the first pipe 211.

Effects of Second Embodiment

The electronic instrument according to the present embodiment described above provides the effects below as well as the same effects as those provided by the electronic instrument 1 according to the first embodiment.

In the cooling apparatus 3B, the first vapor chamber 6 is formed in the folded shape, in which portions of the second plate 63 face each other. The second plate 63 has the second inner surface constituting region 632, which faces the first inner surface constituting region 631 at the outer surface 63A of the second plate 63 and constitutes at least a part of the second inner surface 75 facing the first inner surface 74 in the liquid cooling section 7.

According to the configuration described above, the heat of the heat source can be transferred not only to the first inner surface 74, but also to the second inner surface 75 facing the first inner surface 74 in the liquid cooling section 7. The heat of the heat source can therefore be transferred to the liquid refrigerant not only via the first inner surface 74 and the plurality of first fins FnB1, but also via the second inner surface 75. Therefore, the efficiency of heat transfer to the liquid refrigerant can be increased, and the efficiency at which the cooling target CT, which is the heat source, is cooled can in turn be increased.

The cooling apparatus 3B includes the plurality of second fins FnB2, which are provided at the second inner surface 75 and form a part of the channel of the liquid refrigerant.

According to the configuration described above, the heat transferred to the second inner surface 75 via the plurality of second fins FnB2 can be readily transferred to the liquid refrigerant. The cooling target CT, which is the heat source, can therefore be more efficiently cooled.

In the cooling apparatus 3B, the plurality of second fins FnB2 are disposed in the upstream region facing the introduction port 72 in the liquid refrigerant channel, and the plurality of first fins FnB1 are disposed in the downstream region facing the discharge port 73 in the liquid refrigerant channel. The plurality of second fins FnB2 correspond to one of the plurality of first fins and the plurality of second fins, and the plurality of first fins FnB1 correspond to the other.

The heat is more readily transferred to the base portion of each of the first fins FnB1 than to the tip portion thereof, so that the temperature at the base portion of each of the first fins FnB1 is higher than the temperature at the tip portion thereof. Similarly, the temperature at the base portion of each of the second fins FnB2 is higher than the temperature at the tip portion thereof.

The liquid refrigerant flowing between the first inner surface 74 and the second inner surface 75 can therefore suppress an increase in the difference in the temperature of the liquid refrigerant in the direction from the first inner surface 74 toward the second inner surface 75, whereby the heat of the liquid refrigerant can be homogenized. That is, a local increase in the temperature of the liquid refrigerant can be suppressed, whereby the heat can be efficiently transferred from each of the fins FnB to the liquid refrigerant.

The heat of the cooling target CT is more likely to be transferred to the first inner surface constituting region 631, which is closer to the cooling target CT, which is the heat source, via the working fluid than to the second inner surface constituting region 632. Therefore, when the liquid refrigerant having flowed along the second fins FnB2 disposed in the second inner surface constituting region 632 flows along the first fins FnB1 disposed in the first inner surface constituting region 631, the heat received from the cooling target CT can be readily transferred to the liquid refrigerant. The efficiency at which the cooling apparatus 3B cools the cooling target CT can therefore be further increased.

Furthermore, interference between the first fins FnB1 and the second fins FnB2 in the flow direction of the liquid refrigerant flowing along the first fins FnB1 and the second fins FnB2 can be suppressed. The fins FnB can therefore be readily disposed in the liquid cooling section 7 as compared, for example, with a case where the plurality of second fins FnB2 are disposed between the plurality of first fins FnB1.

The liquid cooling section 7, and hence the cooling apparatus 3B, can therefore be assembled with increased easiness.

Variations of Second Embodiment

In the cooling apparatus 3B described above, the plurality of first fins FnB1 disposed in the first inner surface constituting region 631 are disposed downstream from the plurality of second fins FnB2 disposed in the second inner surface constituting region 632 in the liquid refrigerant channel, but not necessarily. The plurality of first fins FnB1 may be disposed upstream from the plurality of second fins FnB2 in the liquid refrigerant channel. The arrangement of the first and second fins can be changed as appropriate.

First Variation of Cooling Apparatus According to Second Embodiment

Figure 8:
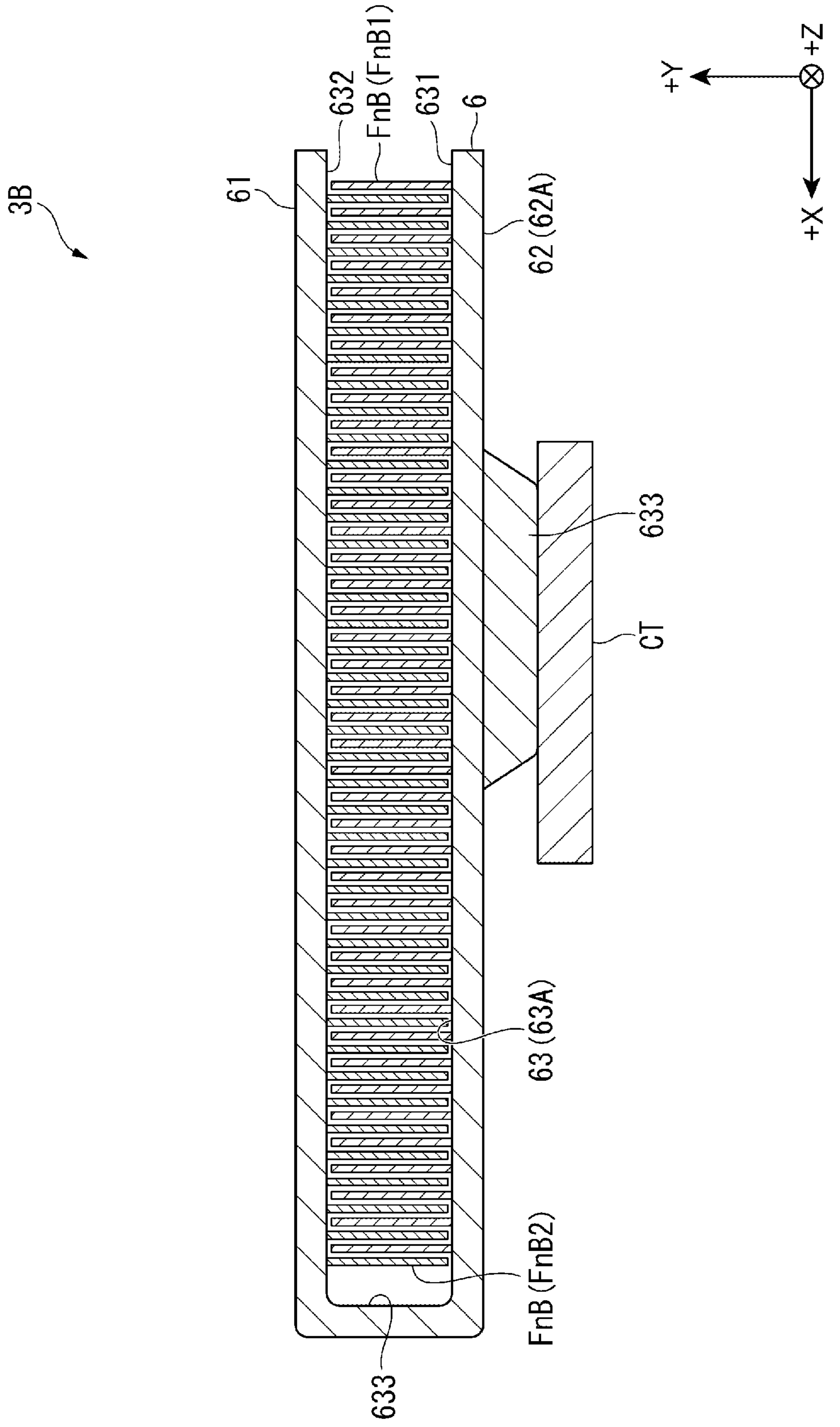
FIG. 8 shows a first variation of the cooling apparatus according to the second embodiment.

FIG. 8 shows a first variation of the cooling apparatus 3B and a first variation of the arrangement of the first fins FnB1 and the second fins FnB2. In other words, FIG. 8 shows the first fins FnB1 and the second fins FnB2 according to the first variation viewed from the side facing the negative end of the direction Z. In FIG. 8, the liquid cooling section 7 is not shown, and some of the plurality of first fins FnB1 and some of the plurality of second fins FnB2 have reference characters.

In the example shown in FIG. 8, the plurality of first fins FnB1 disposed in the first inner surface constituting region 631 and the plurality of second fins FnB2 disposed in the second inner surface constituting region 632 are alternately arranged in the direction X toward the positive end thereof. That is, the plurality of first fins FnB1 are arranged with a gap therebetween in the direction X toward the positive end thereof, which is the first direction. The plurality of second fins FnB2 are arranged with a gap therebetween in the direction X toward the positive end thereof. The plurality of first fins FnB1 and the plurality of second fins FnB2 overlap with each other when viewed from the side facing the positive end of the direction X and are alternately arranged in the direction X toward the positive end thereof. The plurality of first fins FnB1 and the plurality of second fins FnB2 form a part of the channel of the liquid refrigerant introduced into the liquid cooling section 7. In detail, a liquid refrigerant channel is formed between a first fin FnB1 and a second fin FnB2 shifted from the first fin FnB1 toward the positive end of the direction X, and another liquid refrigerant channel is formed between the second fin FnB2 and a first fin FnB1 shifted from the second fin FnB2 toward the positive end of the direction X.

The plurality of first fins FnB1 each extend across substantially the entire first inner surface constituting region 631 toward the positive end of the direction Z. Similarly, the plurality of second fins FnB2 each extend across substantially the entire second inner surface constituting region 632 toward the positive end of the direction Z. The first fins FnB1 and the second fins FnB2 have the same dimension in the direction X toward the positive end thereof. The first fins FnB1 and the second fins FnB2 have the same dimension in the direction Y toward the positive end thereof. The first fins FnB1 and the second fins FnB2 have the same dimension in the direction Z toward the positive end thereof.

Furthermore, the plurality of first fins FnB1 and the plurality of second fins FnB2 are arranged at the same intervals in the direction X toward the positive end thereof.

Moreover, the tip of each of the first fins FnB1 that faces the positive end of the direction Y may or may not be in contact with the second inner surface constituting region 632. Similarly, the tip of each of the second fins FnB2 that faces the negative end of the direction Y may or may not be in contact with the first inner surface constituting region 631.

The cooling apparatus 3B, in which the plurality of first fins FnB1 and the plurality of second fins FnB2 are arranged as described above, can provide the following effects.

That is, in the cooling apparatus 3B according to the first variation, the plurality of first fins FnB1 are arranged with a gap therebetween in the direction X toward the positive end thereof, which is the first direction, and the plurality of second fins FnB2 are arranged with a gap therebetween in the direction X toward the positive end thereof. The plurality of first fins FnB1 and the plurality of second fins FnB2 overlap with each other when viewed from the positive end of the direction X, and are alternately arranged in the direction X toward the positive end thereof to form a part of the liquid refrigerant channel.

According to the configuration described above, when the liquid refrigerant flows between the first fins FnB1 and the second fins FnB2, which are alternately arranged, the heat can be readily transferred from each of the first fins FnB1 and the second fins FnB2 to the liquid refrigerant. The cooling target CT, which is the heat source, can therefore be efficiently cooled. The width of each of the channels formed by the first fins FnB1 and the second fins FnB2 can be reduced without reducing the intervals at which the first fins FnB1 and the second fins FnB2 are arranged, whereby a large number of channels can be formed. The contact area over which the first fins FnB1 and the second fins FnB2 are in contact with the liquid refrigerant, which is the contact area required for heat exchange from the first fins FnB1 and the second fins FnB2 to the liquid refrigerant can thus be ensured.

Second Variation of Cooling Apparatus According to Second Embodiment

Figure 9:
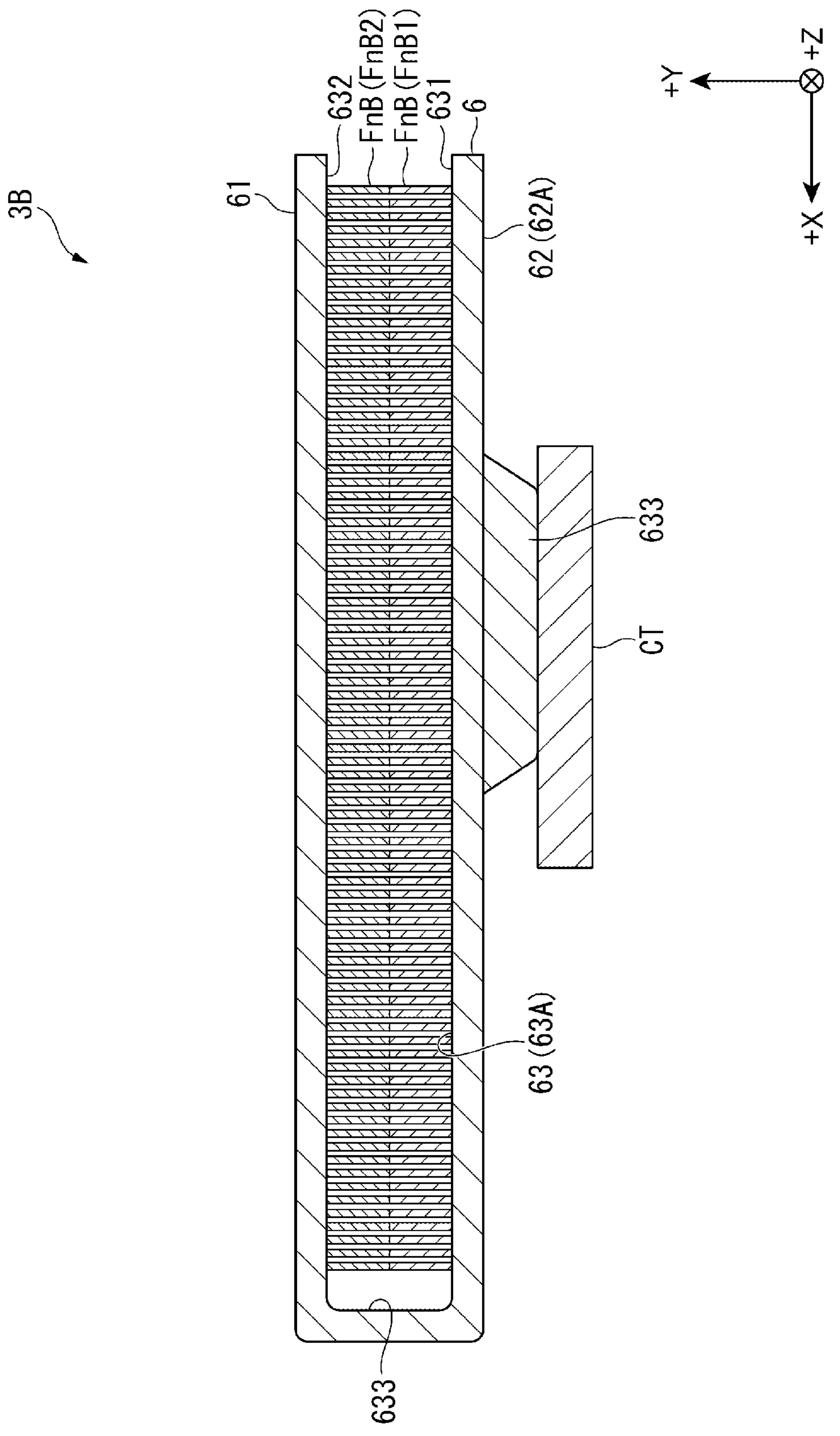
FIG. 9 shows a second variation of the cooling apparatus according to the second embodiment.

FIG. 9 shows a second variation of the cooling apparatus 3B and a second variation of the arrangement of the first fins FnB1 and the second fins FnB2. In other words, FIG. 9 shows the first fins FnB1 and the second fins FnB2 according to the second variation viewed from the side facing the negative end of the direction Z. In FIG. 9, the liquid cooling section 7 is not shown, and some of the plurality of first fins FnB1 and some of the plurality of second fins FnB2 have reference characters.

In the example shown in FIG. 9, the plurality of first fins FnB1 disposed in the first inner surface constituting region 631 are arranged with a gap therebetween in the direction X toward the positive end thereof, which is the first direction. The dimension of each of the first fins FnB1 measured from the first inner surface constituting region 631 in the direction Y toward the positive end thereof is half the distance between the first inner surface constituting region 631 and the second inner surface constituting region 632.

Similarly, the plurality of second fins FnB2 disposed in the second inner surface constituting region 632 are arranged with a gap therebetween in the direction X toward the positive end thereof. The dimension of each of the second fins FnB2 measured from the second inner surface constituting region 632 in the direction Y toward the negative end thereof is half the distance between the first inner surface constituting region 631 and the second inner surface constituting region 632.

The first fins FnB1 and the second fins FnB2 are arranged in the direction X toward the positive end thereof at same intervals.

The plurality of first fins FnB1 and the plurality of second fins FnB2 are disposed so as to overlap with each other when viewed in the direction in which the plurality of first fins FnB1 protrude from the first inner surface 74 but so as not to overlap with each other when viewed in the direction in which the first fins FnB1 are arranged. Specifically, the plurality of first fins FnB1 and the plurality of second fins FnB2 are disposed so as to overlap with each other when viewed from the side facing the positive end of the direction Y but so as not to overlap with each other when viewed from the side facing the positive end of the direction X. The dimension of each of the first fins FnB1 in the direction Y toward the negative end thereof and the dimension of each of the second fins FnB2 in the direction Y toward the positive end thereof may not be half the distance between the first inner surface constituting region 631 and the second inner surface constituting region 632, but one of the first fins FnB1 and the second fins FnB2 may be longer than the other in the direction Y toward the positive or negative end thereof.

The plurality of first fins FnB1 and the plurality of second fins FnB2 form a part of the channel of the liquid refrigerant introduced into the liquid cooling section 7. That is, liquid refrigerant channels are formed between the first fins FnB1 and between the second fins FnB2.

The first fins FnB1 each extend across substantially the entire first inner surface constituting region 631 toward the positive end of the direction Z. Similarly, the second fins FnB2 each extend across substantially the entire second inner surface constituting region 632 toward the positive end of the direction Z. The first fins FnB1 and the second fins FnB2 have the same dimension in the direction X toward the positive end thereof. The first fins FnB1 and the second fins FnB2 have the same dimension in the direction Z toward the positive end thereof. The first fins FnB1 and the second fins FnB2 have the same dimension in the direction Y toward the positive end thereof, as described above. The first fins FnB1 and the second fins FnB2 may, however, have different dimensions in the direction Y toward the positive end thereof.

Furthermore, the tip of each of the first fins FnB1 that faces the positive end of the direction Y and the tip of each of the second fins FnB2 that faces the negative end of the direction Y may or may not be in contact with each other.

The cooling apparatus 3B, in which the plurality of first fins FnB1 and the plurality of second fins FnB2 are arranged as described above, can provide the following effects.

That is, in the cooling apparatus 3B according to the second variation, the plurality of first fins FnB1 are arranged with a gap therebetween in the direction X toward the positive end thereof, which is the first direction, and the plurality of second fins FnB2 are arranged with a gap therebetween in the direction X toward the positive end thereof. The plurality of first fins FnB1 and the plurality of second fins FnB2 are disposed so as to overlap with each other when viewed from the side facing the positive end of the direction Y but so as not to overlap with each other when viewed from the side facing the positive end of the direction X, and form a part of the liquid refrigerant channel. The direction Y toward the positive end thereof corresponds to the direction in which the plurality of first fins FnB1 protrude from the first inner surface constituting region 631, which constitutes the first inner surface 74.

According to the configuration described above, the heat can be readily transferred from the plurality of first fins FnB1 to the liquid refrigerant flowing along the side facing the first inner surface 74, and the heat can be readily transferred from the plurality of second fins FnB2 to the liquid refrigerant flowing along the side facing the second inner surface 75.

Since the first fins FnB1 and the second fins FnB2 overlap with each other when viewed from the side facing the positive end of the direction Y, the fins FnB1 and FnB2 can be readily disposed in the liquid cooling section 7 as compared, for example, with the case where the plurality of second fins FnB2 are disposed between the plurality of first fins FnB1. The liquid cooling section 7, and hence the cooling apparatus 3B, can therefore be assembled with increased easiness.

Third Embodiment

A third embodiment of the present disclosure will next be described.

The electronic instrument according to the present embodiment has the same configuration as that of the electronic instrument 1 according to the first embodiment but differs therefrom in terms of the configuration of the cooling apparatus. In the following description, portions that are the same or substantially the same as the portions having been already described have the same reference characters and will not be described.

Configuration of Electronic Instrument and Circulation-Type Cooling System

Figure 10:
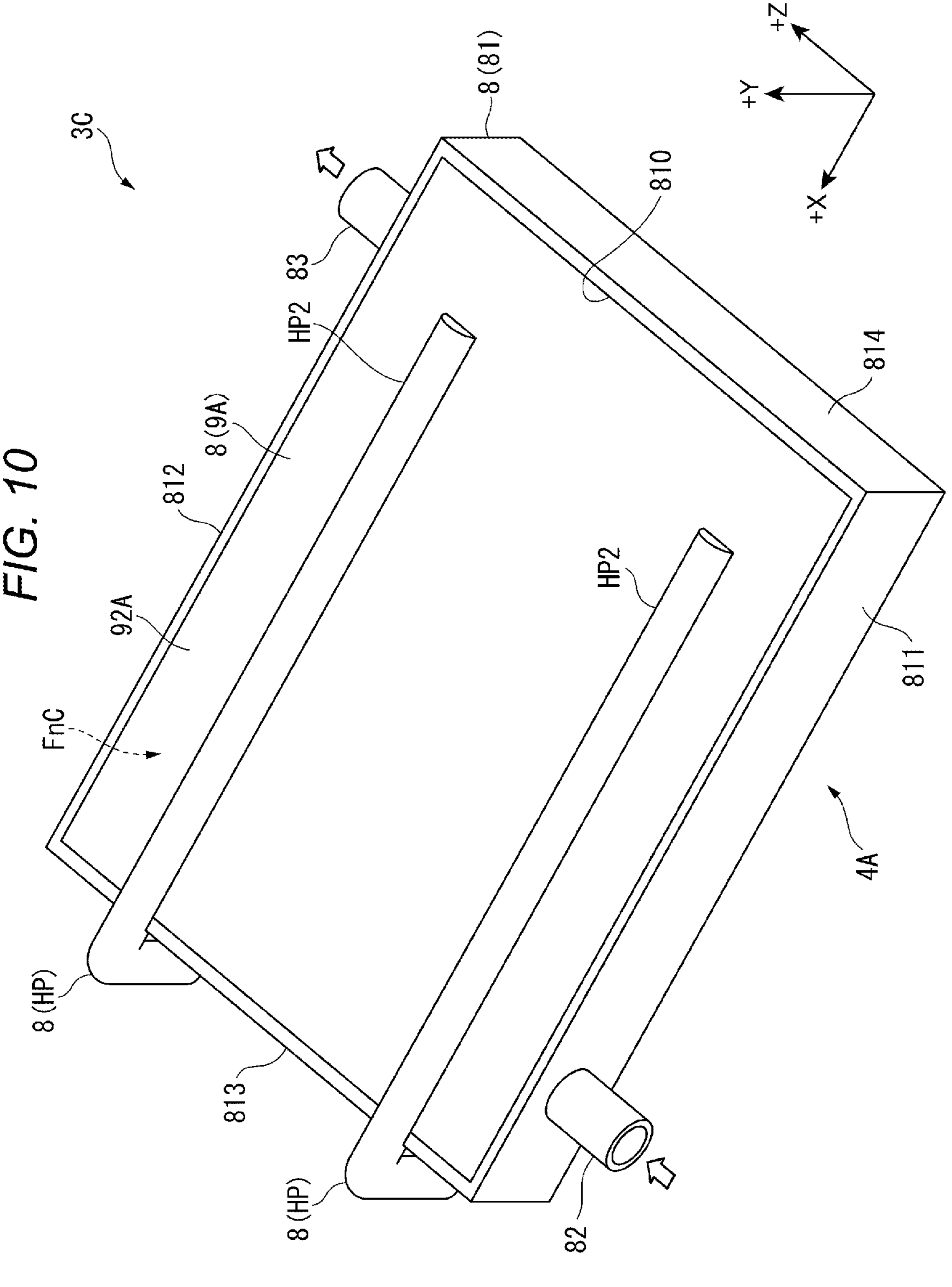
FIG. 10 is a perspective view showing the cooling apparatus according to a third embodiment.

FIG. 10 is a perspective view showing a cooling apparatus 3C according to the present embodiment.

The electronic instrument according to the present embodiment has the same configuration and function as those of the electronic instrument 1 according to the first embodiment except that the cooling apparatus 3A is replaced with the cooling apparatus 3C shown in FIG. 9. That is, the circulation-type cooling system 2 with which the electronic instrument according to the present embodiment is provided has the same configuration and function as the cooling system 2 according to the first embodiment except that the cooling apparatus 3A is replaced with the cooling apparatus 3C.

The cooling apparatus 3C cools the cooling target CT by receiving the heat from the cooling target CT, which is a heat source, and transferring the heat to the liquid refrigerant circulating through the cooling system 2, as in the cooling apparatus 3A according to the first embodiment and the cooling apparatus 3B according to the second embodiment. The cooling apparatus 3C includes a first vapor chamber 4A, a liquid cooling section 8, and a plurality of fins FnC.

Configuration of First Vapor Chamber

Figure 11:
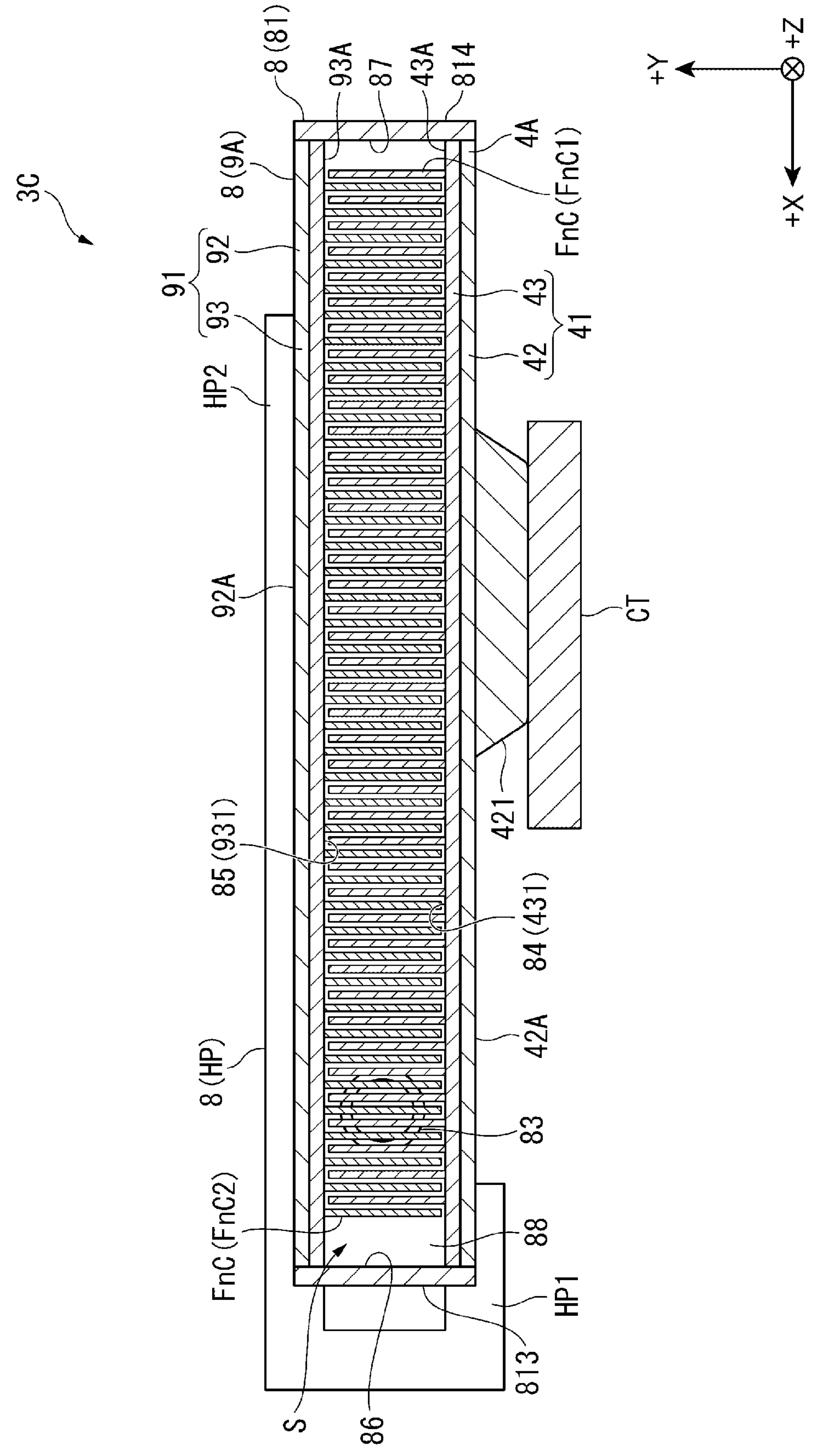
FIG. 11 shows the cross-section of the cooling apparatus according to the third embodiment.

FIG. 11 shows the cross-section of the cooling apparatus 3C taken along the plane XY and viewed from the side facing the negative end of the direction Z. In FIG. 11, some of a plurality of first fins FnC1 and some of a plurality of second fins FnC2 have reference characters.

The first vapor chamber 4A has the same configuration and function as those of the first vapor chamber 4 except that a protrusion 421, which is coupled to the cooling target CT, which is the heat source, is provided at the first plate 42. That is, the first vapor chamber 4A is configured to have the shape of a planar plate extending along the plane XZ. The first vapor chamber 4A, when combined with a liquid cooling container 81 of the liquid cooling section 8, forms the flow space S, where the liquid refrigerant flows.

The outer surface 43A of the first vapor chamber 4A forms a first inner surface 84 of the liquid cooling section 8 when the first vapor chamber 4A and the liquid cooling container 81 are combined with each other. That is, the second plate

43 has the first inner surface constituting region 431, which is provided at the outer surface 43A and constitutes the first inner surface 84.

Configuration of Liquid Cooling Section

The liquid cooling section 8 is combined with the first vapor chamber 4A, as shown in FIG. 11. The liquid cooling section 8 includes the liquid cooling container 81, a second vapor chamber 9A, which is a heat transfer member, and heat pipes HP, as shown in FIG. 10. That is, the cooling apparatus 3C includes the first vapor chamber 4A, the second vapor chamber 9A, the heat pipes HP, and the liquid cooling container 81. The liquid cooling container 81 will be described later in detail.

Configuration of Second Vapor Chamber

The second vapor chamber 9A is coupled to the first vapor chamber 4A via the heat pipes HP in a heat-transferable manner, and transfers the heat transferred from the first vapor chamber 4A to the liquid refrigerant flowing in the liquid cooling section 8. The second vapor chamber 9A is formed in the shape of a planar plate extending along the plane XZ, as the first vapor chamber 4 according to the first embodiment is, and is disposed at a position shifted from the first vapor chamber 4A toward the positive end of the direction Y. The second vapor chamber 9A includes a second sealed container 91, which is a combination of a first plate 92 and a second plate 93, has the shape of a planar plate, and encapsulates a working fluid having a phase changeable between the liquid phase and the gas phase. The working fluid encapsulated in the second sealed container 91 is a second working fluid.

In the second vapor chamber 9A, the first plate 92 corresponds to a third plate, and the second plate 93 corresponds to a fourth plate.

The first plate 92 is disposed at a position shifted from the second plate 93 toward the positive end of direction Y. The first plate 92 vaporizes the liquid-phase working fluid held by the mesh, which is not shown but is provided in the first plate 92, with the aid of the heat transferred from the heat pipes HP.

An outer surface 92A of the first plate 92, which is the surface opposite from the second plate 93, constitutes a part of the outer surface of the second vapor chamber 9A. The outer surface 92A is coupled to second couplers HP2 of the heat pipes HP, and the heat is transferred from the first vapor chamber 4A via the heat pipes HP.

Although not shown, the first plate 92 has an inner surface facing the second plate 93, and the inner surface forms a part of the inner surface of the second sealed container 91. The inner surface is provided with a mesh that holds the liquid-phase working fluid.

The second plate 93 is disposed at a position shifted from the first plate 92 toward the negative end of the direction Y. The second plate 93 dissipates the heat transferred to the first plate 92.

Although not shown, the second plate 93 has an inner surface facing the first plate 92, and the inner surface forms a part of the inner surface of the second sealed container 91.

An outer surface 93A of the second plate 93, which is the surface opposite from the first plate 92, dissipates the heat transferred to the second plate 93. The outer surface 93A constitutes a second inner surface 85 of the liquid cooling section 8 when the second vapor chamber 9A is combined with the liquid cooling container 81. That is, the second plate 93 has a second inner surface constituting region 931, which constitutes the second inner surface 85.

Configuration of Heat Pipes

The heat pipes HP couple the first vapor chamber 4A to the second vapor chamber 9A in a heat-transferable manner, and the cooling apparatus 3C is provided with a plurality of heat pipes HP. In the present embodiment, the cooling apparatus 3C is provided with two heat pipes HP. The heat pipes HP each has a first coupler HP1 provided at one end and the second coupler HP2 provided at the other end.

The first coupler HP1 is a heat receiver. The first coupler HP1 is coupled to the outer surface 42A of the first plate 42 of the first vapor chamber 4A.

The second coupler HP2 is a heat dissipator. The second coupler HP2 is coupled to the outer surface 92A of the first plate 92 of the second vapor chamber 9A. The outer surface 92A is the outer surface corresponding to the second inner surface 85 and corresponds to a first outer surface.

The heat received at the first couplers HP1 vaporizes part of the working fluid encapsulated in the heat pipes HP. The vaporized working fluid moves to the second couplers HP2, which are each a heat dissipating end, and transfers the heat to the second couplers HP2. The working fluid thus condenses at the second couplers HP2. The working fluid having condensed moves through the heat pipes HP with the aid of capillary force and returns again to the first couplers HP1.

The thus configured heat pipes HP cause the heat received from the first plate 42 at the first couplers HP1 to be transferred to the outer surface 92A of the second vapor chamber 9A at the second couplers HP2.

In the present embodiment, the second couplers HP2 of the heat pipes HP each extend from the end of the outer surface 92A that faces the positive end of the direction X toward the negative end of the direction X. The end of each of the second couplers HP2 that faces the negative end of the direction X is located at a position shifted toward the negative end of the direction X from the center, of the outer surface 92A, in the direction X toward the positive end thereof. That is, the end of each of the second couplers HP2 is located at a position shifted from the center, of the outer surface 92A, in the direction in which the second couplers HP2 extend along the outer surface 92A corresponding to the second inner surface 85 in the second vapor chamber 9A, which is the heat transfer member.

The heat is therefore readily transferred from the heat pipes HP to a wide range of the second vapor chamber 9A.

Configuration of Liquid Cooling Container

The liquid cooling container 81 is a combination of the first vapor chamber 4A and the second vapor chamber 9A to constitute the flow space S, where the liquid refrigerant circulating through the circulation-type cooling system 2 flows, as shown in FIGS. 10 and 11. The liquid cooling container 81 is configured to have the shape of a frame. The liquid cooling container 81 has a through port 810, wall sections 811, 812, 813, and 814, an introduction port 82, and a discharge port 83, as shown in FIG. 10.

The through port 810 passes through the liquid cooling container 81 along the direction Y toward the positive end thereof. The circumferential edge of the through port 810 is formed by the wall sections 811, 812, 813, and 814.

The wall sections 811 and 812 are wall sections extending along the plane XY and face each other in the direction Z toward the positive end thereof. The wall section 811 is disposed at a position shifted from the flow space S toward the negative end of the direction Z, and the wall section 812 is disposed at a position shifted from the flow space S toward the positive end of the direction Z.

The wall section 811 is provided with the introduction port 82. The introduction port 82 is coupled to the fourth pipe 214 shown in FIG. 1 and introduces the liquid refrigerant delivered from the pump 24 into the liquid cooling section 8.

The wall section 812 is provided with the discharge port 83. The discharge port 83 is coupled to the first pipe 211 shown in FIG. 1 and discharges the liquid refrigerant having flowed in the liquid cooling section 8 into the tank 22.

The wall sections 813 and 814 are wall sections extending along the plane YZ and face each other in the direction X toward the positive end thereof. The wall section 813 is disposed at a position shifted from the flow space S toward the positive end of the direction X, and the wall section 814 is disposed at a position shifted from the flow space S toward the negative end of the direction X.

The thus configured liquid cooling container 81 is combined with the first vapor chamber 4A from the side facing the negative end of the direction Y, and further combined with the second vapor chamber 9A from the side facing the positive end of the direction Y. That is, the through port 810 is closed by the first vapor chamber 4A and the second vapor chamber 9A. The flow space S, which is surrounded by the first inner surface 84, the second inner surface 85, a third inner surface 86, a fourth inner surface 87, a fifth inner surface 88, and a sixth inner surface that is not shown is thus formed in the liquid cooling section 8, as shown in FIG. 11. That is, the liquid cooling section 8 has the first inner surface 84, the second inner surface 85, the third inner surface 86, the fourth inner surface 87, the fifth inner surface 88, and the sixth inner surface, which is not shown, which form the flow space S.

Out of the inner surfaces of the liquid cooling section 8, the first inner surface 84 is the inner surface facing the positive end of the direction Y. At least a part of the first inner surface 84 is formed of the first inner surface constituting region 431 of the first vapor chamber 4A.

Out of the inner surfaces of the liquid cooling section 8, the second inner surface 85 is the inner surface facing the negative end of the direction Y and faces the first inner surface 84. At least a part of the second inner surface 85 is formed of the second inner surface constituting region 931 of the second vapor chamber 9A.

Out of the inner surfaces of the liquid cooling section 8, the third inner surface 86 is the inner surface facing the negative end of the direction X. The third inner surface 86 is formed of the inner surface of the wall section 813.

Out of the inner surfaces of the liquid cooling section 8, the fourth inner surface 87 is the inner surface facing the positive end of the direction X and faces the third inner surface 86. The fourth inner surface 87 is formed of the inner surface of the wall section 814.

Out of the inner surfaces of the liquid cooling section 8, the fifth inner surface 88 is the inner surface facing the negative end of the direction Z and is also the inner surface of the wall section 812. The discharge port 83 opens through the fifth inner surface 88.

Out of the inner surfaces of the liquid cooling section 8, the sixth inner surface is, although not shown, the inner surface facing the positive end of the direction Z and faces the fifth inner surface 88. The sixth inner surface is formed of the inner surface of the wall section 811.

The plurality of fins FnC disposed in the first inner surface constituting region 431 and the second inner surface constituting region 931 are disposed in the thus configured flow space S.

Configuration of Plurality of Fins

The plurality of fins FnC are disposed in the flow space S provided in the liquid cooling section 8, as the plurality of fins FnB in the cooling apparatus 3B according to the second embodiment are. The plurality of fins FnC include a plurality of first fins FnC1 disposed in the first inner surface constituting region 431 and a plurality of second fins FnC2 disposed in the second inner surface constituting region 931.

The plurality of first fins FnC1 are disposed in the first inner surface constituting region 431 and protrude from the first inner surface constituting region 431 toward the positive end of the direction Y. The plurality of first fins FnC1 extend toward the positive end of the direction Z and are arranged with a gap therebetween in the direction X toward the positive end thereof, which is the first direction.

The plurality of second fins FnC2 are disposed in the second inner surface constituting region 931 and protrude from the second inner surface constituting region 931 toward the negative end of the direction Y. The plurality of second fins FnC2 extend toward the positive end of the direction Z and are arranged with a gap therebetween in the direction X toward the positive end thereof, which is the first direction.

The plurality of first fins FnC1 have the same configuration as that of the plurality of first fins FnB1, and the plurality of second fins FnC2 have the same configuration as that of the plurality of second fins FnB2. The arrangement of the plurality of first fins FnC1 and the plurality of second fins FnC2 is the same as the arrangement of the plurality of first fins FnB1 and the plurality of second fins FnB2 shown in the second embodiment.

For example, the plurality of first fins FnC1 and the plurality of second fins FnC2 may overlap with each other when viewed in the direction X toward the positive end thereof, which is the first direction, and may be alternately arranged in the direction X toward the positive end thereof to form a part of the liquid refrigerant channel, as shown in FIG. 11. In this case, the first fins FnC1 are disposed across substantially the entire first inner surface constituting region 431, and the second fins FnC2 are disposed across substantially the entire second inner surface constituting region 931.

For example, the plurality of first fins FnC1 may be disposed in the region facing the positive end of the direction Z in the first inner surface constituting region 431, and the plurality of second fins FnC2 may be disposed in region facing the negative end of the direction Z in the second inner surface constituting region 931, as the fins FnB shown in FIG. 7 are. That is, the plurality of first fins FnC1 may be disposed in the upstream region facing the introduction port 82 in the liquid refrigerant channel, and the plurality of second fins FnC2 may be disposed in the downstream region facing the discharge port 83 in the channel.

Instead, for example, the plurality of first fins FnC1 and the plurality of second fins FnC2 may be disposed so as to overlap with each other when viewed from the side facing the positive end of the direction Y but so as not to overlap with each other when viewed from the side facing the positive end of the direction X to form a part of the liquid refrigerant channel, as the fins FnB shown in FIG. 9 are. The direction Y toward the positive end thereof corresponds to the direction in which the plurality of first fins FnC1 protrude from the first inner surface constituting region 431, which constitutes the first inner surface 84. In this case, the first fins FnC1 are disposed across substantially the entire first inner surface constituting region 431, and the second fins FnC2 are disposed across substantially the entire second inner surface constituting region 931.

Cooling of Cooling Target Performed by Cooling Apparatus

Since the cooling target CT, which is the heat source, is coupled to the protrusion 421 of the first vapor chamber 4A, the heat of the cooling target CT is transferred to the first plate 42 of the first vapor chamber 4A via the protrusion 421. The working fluid, which is the first working fluid, is encapsulated in the first vapor chamber 4A. In the first vapor chamber 4A, the heat received from the cooling target CT vaporizes the liquid-phase working fluid held in the mesh, and the gas-phase working fluid diffuses in the first vapor chamber 4A. Part of the gas-phase working fluid condenses into the liquid-phase working fluid by transferring the heat to the inner surface corresponding to the first inner surface constituting region 431, and the other part of the gas-phase working fluid condenses into the liquid-phase working fluid by transferring the heat to the inner surface corresponding to the first couplers HP1 of the heat pipes HP. The liquid-phase working fluid travels through the mesh and reaches the inner surface corresponding to the cooling target CT.

Part of the heat transferred to the inner surface corresponding to the first inner surface constituting region 431 is transferred to the plurality of first fins FnC1 disposed in the first inner surface constituting region 431, and the other part of the heat is transferred to the region where the first fins FnC1 are not disposed in the first inner surface constituting region 431. The heat transferred to the inner surface of the first plate 42 that corresponds to the first couplers HP1 is transferred to the outer surface 92A of the second vapor chamber 9A via the heat pipes HP. The working fluid, which is the second working fluid, is encapsulated in the second vapor chamber 9A.

The heat transferred to the outer surface 92A vaporizes the liquid-phase working fluid at the inner surface of the first plate 92, and the gas-phase working fluid diffuses in the second vapor chamber 9A. Part of the gas-phase working fluid condenses into the liquid-phase working fluid by transferring the heat to the inner surface corresponding to the second inner surface constituting region 931. Part of the heat transferred to the inner surface is transferred to the plurality of second fins FnC2 disposed in the second inner surface constituting region 931, and the other part of the heat is transferred to the region where the second fins FnC2 are not disposed in the second inner surface constituting region 931.

The liquid refrigerant introduced into the liquid cooling section 8 via the introduction port 82 flows toward the positive end of the direction Z along the channels formed by the plurality of first fins FnC1 and the plurality of second fins FnC2. The heat transferred to the fins FnC is thus transferred to the liquid refrigerant. In other words, the plurality of fins FnC to which the heat of the cooling target CT has been transferred are cooled by the liquid refrigerant, and the cooling target CT is in turn cooled. The liquid refrigerant having flowed in the liquid cooling section 8 is discharged via the discharge port 83 into the first pipe 211.

Effects of Third Embodiment

The electronic instrument according to the present embodiment described above provides the effects below as well as the same effects as those provided by the electronic instruments according to the first and second embodiments.

In the cooling apparatus 3C, the liquid cooling section 8 includes the second vapor chamber 9A, which is the heat transfer member, and the heat pipes HP. The second vapor chamber 9A is combined with the liquid cooling container 81 to form the heat transfer member that constitutes the second inner surface 85, which faces the first inner surface 84 in the liquid cooling section 8. The heat pipes HP thermally couple the outer surface 42A of the first plate 42, which is the surface that faces the cooling target CT, to the second vapor chamber 9A. The outer surface 42A corresponds to a first-plate-side outer surface.

According to the configuration described above, the heat of the cooling target CT can be transferred not only to the first inner surface 84 in the liquid cooling section 8, but also to the second inner surface 85 facing the first inner surface 84. The heat of the cooling target CT can therefore be transferred to the liquid refrigerant not only via the first inner surface 84 and the plurality of first fins FnC1, but also via the second inner surface 85. Therefore, the efficiency of heat transfer to the liquid refrigerant can be increased, and the efficiency at which the cooling target CT is cooled can in turn be increased.

The second vapor chamber 9A, which is the heat transfer member, is the combination of the first plate 92 and the second plate 93 facing the first plate 92. In the second vapor chamber 9A, the second working fluid encapsulated therein vaporizes and condenses. The first plate 92 corresponds to the third plate, and the second plate 93 corresponds to the fourth plate.

According to the configuration described above, the heat transferred from the first vapor chamber 4A to the second vapor chamber 9A via the heat pipes HP can be dispersed via the second inner surface 85. The heat at the second inner surface 85 can thus be homogenized, and can be efficiently transferred to the liquid refrigerant flowing along the second inner surface 85. The efficiency at which the cooling target CT, which is the heat source, is cooled can therefore be increased.

The heat pipes HP include the second couplers HP2, which are coupled to the second vapor chamber 9A. The second couplers HP2 are one type of the couplers with which the heat pipes HP are provided. The end of each of the second couplers HP2 is located at a position shifted from the center, of the outer surface 92A, in the direction X toward the positive end thereof. The direction X toward the positive end thereof corresponds to the direction in which the second couplers HP2 extend along the outer surface 92A corresponding to the second inner surface 85 in the second vapor chamber 9A, and the outer surface 92A corresponds to the first outer surface.

According to the configuration described above, the heat can be transferred from the heat pipes HP over a wide range in the second vapor chamber 9A. The heat at the second inner surface 85 can thus be homogenized, and can be efficiently transferred to the liquid refrigerant flowing along the second inner surface 85. The efficiency at which the cooling targets CT is cooled can therefore be increased.

The cooling apparatus 3C includes the plurality of second fins FnC2, which are provided at the second inner surface 85 and form a part of the liquid refrigerant channel.

According to the configuration described above, the heat transferred to the second inner surface 85 via the plurality of second fins FnC2 provided at the second inner surface 85 can be readily transferred to the liquid refrigerant. The cooling target CT can therefore be more efficiently cooled.

First Variation of Third Embodiment

Figure 12:
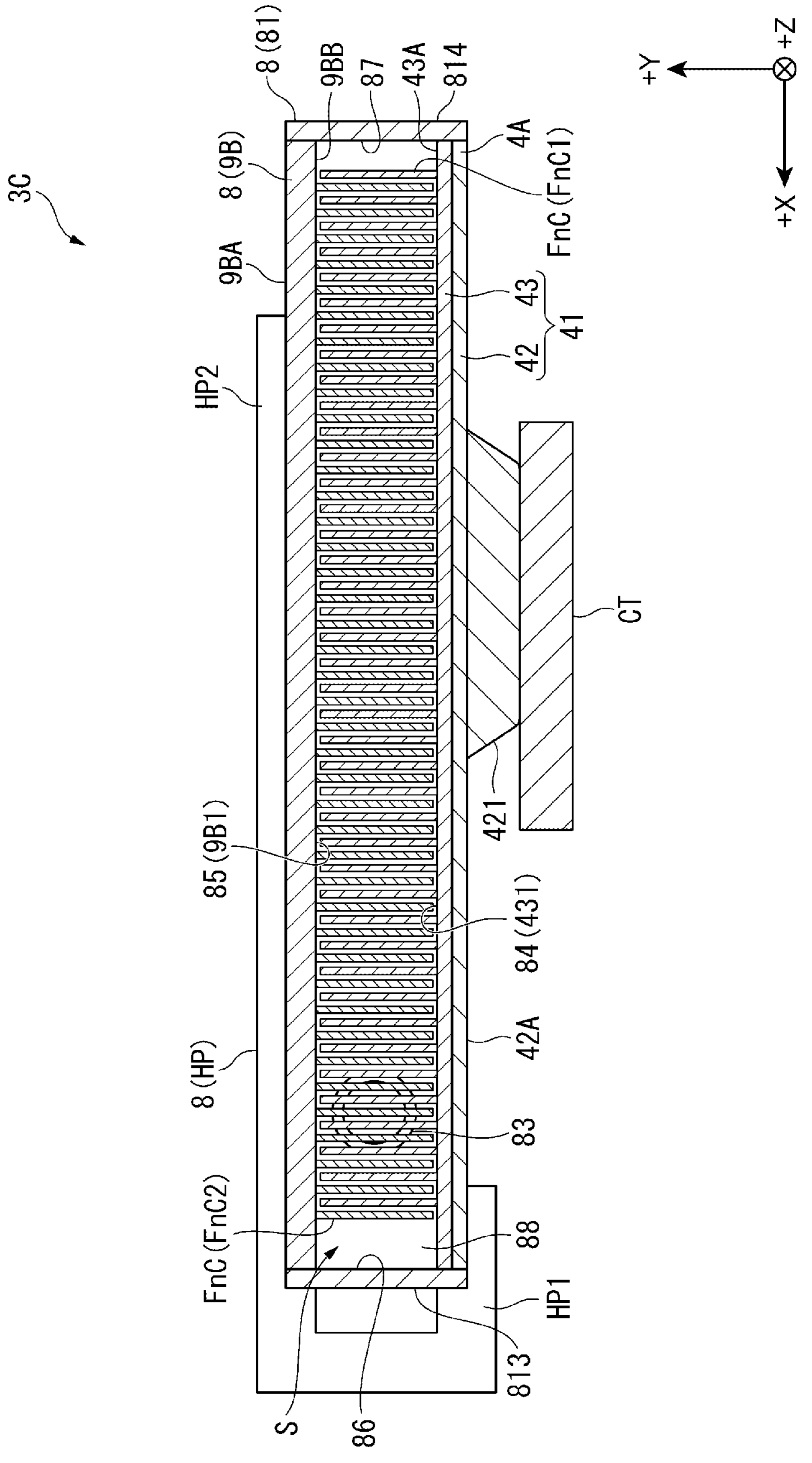
FIG. 12 shows a first variation of the cooling apparatus according to the third embodiment.

FIG. 12 shows a first variation of the cooling apparatus 3C and specifically shows a cross section of the cooling apparatus 3C according to the first variation taken along the plane XY and viewed from the side facing the negative end of the direction Z. In FIG. 12, some of the plurality of first fins FnC1 and some of the plurality of second fins FnC2 have reference characters.

In the cooling apparatus 3C described above, the liquid cooling section 8 includes the second vapor chamber 9A as the heat transfer member, but not necessarily. The liquid cooling section 8 may not necessarily include the second vapor chamber 9A and may include another heat transfer member.

For example, the liquid cooling section 8 of the cooling apparatus 3C shown in FIG. 12 includes a metal member 9B, which has the shape of a planar plate extending along the plane XZ, as the heat transfer member. The second couplers HP2 of the heat pipes HP are coupled to a surface 9BA of the metal member 9B, which is a surface facing the positive end of the direction Y. A surface 9BB of the metal member 9B, which is a surface facing the negative end of the direction Y, constitutes the second inner surface 85 when the metal member 9B is combined with the liquid cooling container 81. That is, the metal member 9B has a second inner surface constituting region 9B1, which is provided at the surface 9BB and constitutes the second inner surface 85. The plurality of second fins FnC2 are disposed in the second inner surface constituting region 9B1.

The cooling apparatus 3C including the thus configured metal member 9B can also provide the same effects as those provided by the cooling apparatus 3C including the second vapor chamber 9A.

Second Variation of Third Embodiment

Figure 13:
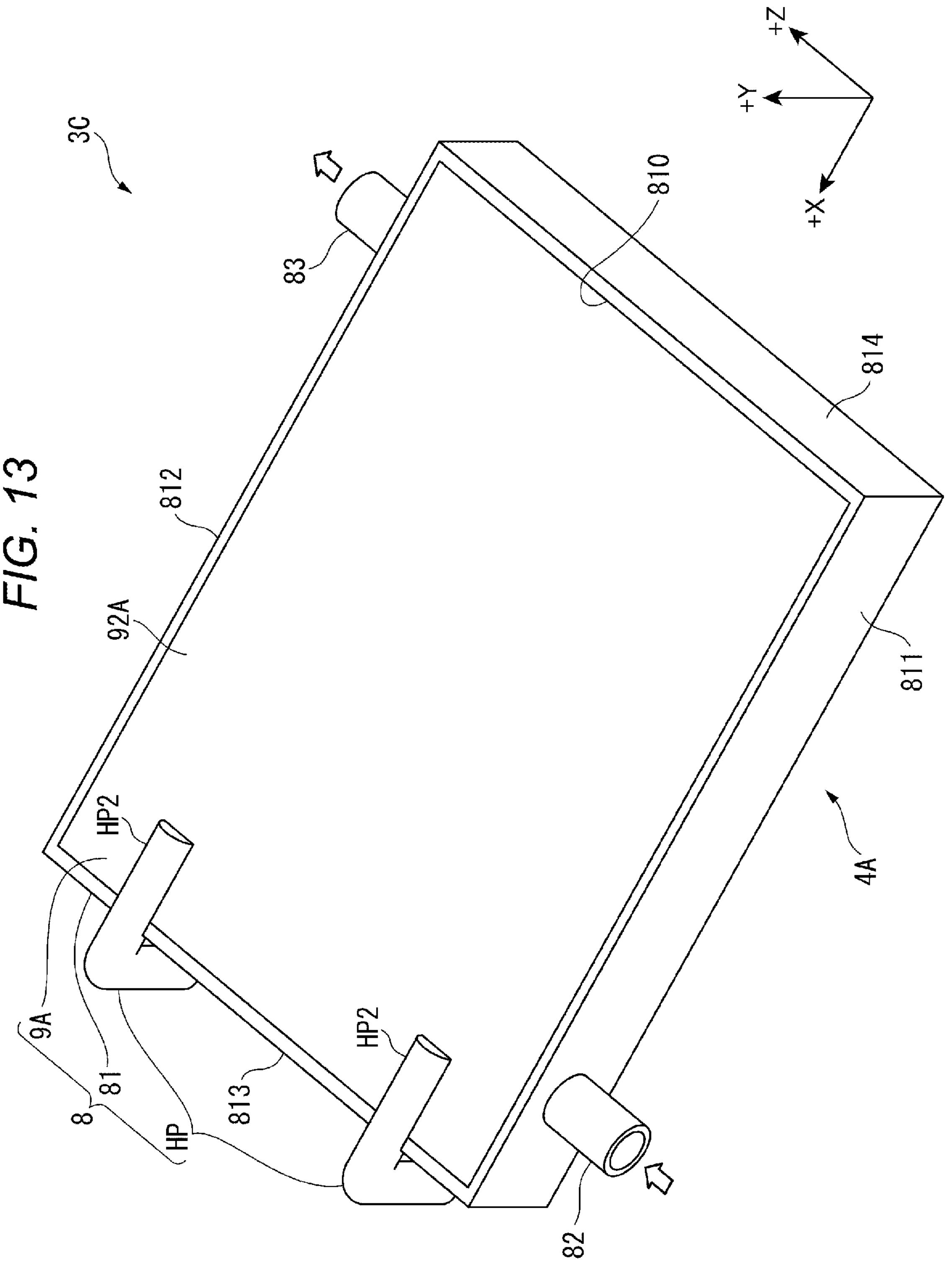
FIG. 13 shows a second variation of the cooling apparatus according to the third embodiment.

FIG. 13 shows a second variation of the cooling apparatus 3C and is a side view of the cooling apparatus 3C according to the second variation viewed from the side facing the negative end of the direction Z.

In the cooling apparatus 3C described above, the end of each of the second couplers HP2 is located at a position shifted from the center, of the outer surface 92A, in the direction in which the second couplers HP2 extend in the second vapor chamber 9A. That is, the end of each of the second couplers HP2 is located at a position shifted from the center, of the outer surface 92A, in the direction X toward the positive end thereof, but not necessarily.

For example, the end of each of the second couplers HP2 may be located at a position that is not beyond the center, of the outer surface 92A, in the direction X toward the positive end thereof, which is the direction in which the second couplers HP2 extend, as shown in FIG. 13. The same applies to a case where the cooling apparatus 3C includes the metal member 9B as the heat transfer member in place of the second vapor chamber 9A.

Variations of Embodiments

The present disclosure is not limited to the embodiments described above, and variations, improvements, and other modifications to the extent that the advantage of the present disclosure is achieved fall within the scope of the present disclosure.

In each of the embodiments described above, it is assumed that the liquid refrigerant flows in the cooling system 2 from one of the cooling apparatuses 3A, 3B, and 3C sequentially through the tank 22, the radiator 23, and the pump 24, and then flows back to the one cooling apparatus. The order in which the liquid refrigerant flows is, however, not limited to the order described above. For example, the positions of the pump 24 and the radiator 23 may be swapped so that the liquid refrigerant delivered from the pump 24 flows through the radiator 23 and then flows to the cooling apparatus.

In the first embodiment described above, it is assumed that the plurality of first fins FnA have the same dimensions. In the second embodiment described above, it is assumed that the plurality of first fins FnB1 have the same dimensions, and the plurality of second fins FnB2 have the same dimensions. The first fins FnB1 and the second fins FnB2 have the same dimension in direction X toward the positive end thereof, the first fins FnB1 and the second fins FnB2 have the same dimension in direction Y toward the positive end thereof, and the first fins FnB1 and the second fins FnB2 have the same dimension in direction Z toward the positive end thereof. In the third embodiment described above, it is assumed that the first fins FnC1 and the first fins FnB1 have the same dimensions, and that the second fins FnC2 and the second fins FnB2 have the same dimensions. It is further assumed that the plurality of first fins FnB1 and the plurality of second fins FnB2 are arranged at the same intervals. In the present disclosure, the term "the same" is not limited to exactly "the same". The dimensions of the fins and the intervals at which the fins are arranged are not limited to those described above and can be changed as appropriate.

For example, the dimensions of some of the plurality of first fins FnA may differ from the dimensions of the other first fins FnA. The dimensions of some of the plurality of first fins FnB1 and FnC1 may differ from the dimensions of the other first fins FnB1 and FnC1. The dimensions of some of the plurality of second fins FnB2 and FnC2 may differ from the dimensions of the other second fins FnB2 and FnC2. Furthermore, the plurality of first fins FnB1 and the plurality of second fins FnB2 may be arranged at different intervals. The fins may be formed of fins having different thicknesses, and arranged at different intervals. In addition, some of the intervals at which the fins are arranged may differ from other intervals for manufacturing purposes.

In the second embodiment described above, it is assumed that the first vapor chamber 6 is formed in a folded shape and has the first inner surface constituting region 631, which constitutes the first inner surface 74 of the liquid cooling section 7, the second inner surface constituting region 632, which constitutes the second inner surface 75 of the liquid cooling section 7, and the third inner surface constituting region 633, which constitutes the third inner surface 76 of the liquid cooling section 7, but not necessarily. The first vapor chamber 6 may be configured to have, for example, a circular shape, such as an oval shape, when viewed from the side facing the negative end of the direction Z, and may have a fourth inner surface constituting region that constitutes a fourth inner surface facing the third inner surface 76 in addition to the first inner surface constituting region 631, the second inner surface constituting region 632, and the third inner surface constituting region 633.

In the second embodiment described above, it is assumed that the plurality of second fins FnB2 are disposed in the second inner surface constituting region 632 of the first vapor chamber 6. In the third embodiment described above, it is assumed that the plurality of second fins FnC2 are disposed in the second inner surface constituting region 931 of the second vapor chamber 9A or the second inner surface constituting region 9B1 of the metal member 9B. The second and third embodiments are, however, not necessarily configured as described above, and the plurality of second fins may not be disposed in the second inner surface constituting region, or hence at the second inner surface of the liquid cooling section.

In the first embodiment described above, it is assumed that the plurality of first fins FnA are disposed in the first inner surface constituting region 431. The plurality of first fins FnA may be molded integrally with the second plate 43, for example, by skiving and extrusion, or may be configured separately from the second plate 43 and disposed in the first inner surface constituting region 431. The same applies to the plurality of first fins FnB1 disposed in the first inner surface constituting region 631, and the plurality of second fins FnB2 disposed in the second inner surface constituting region 632 in the second embodiment described above, and the plurality of first fins FnC1 disposed in the first inner surface constituting region 431, and the plurality of second fins FnC2 disposed in the second inner surface configuration region 931 or 9B1 in the third embodiment above.

Summary of Present Disclosure

The present disclosure will be summarized below as additional remarks.

Additional Remark 1

A cooling apparatus includes a first vapor chamber which is formed of a combination of a first plate that receives heat from a heat source and a second plate facing the first plate and in which a first working fluid encapsulated in the first vapor chamber vaporizes and condenses, a liquid cooling section which includes a liquid cooling container combined with the first vapor chamber and in which a liquid refrigerant flowing in the liquid cooling section flows along the first vapor chamber, and a plurality of first fins which are provided in the liquid cooling section and form a part of a channel of the liquid refrigerant. The second plate has a first inner surface constituting region which is located at the outer surface of the second plate and forms at least a part of a first inner surface of the liquid cooling section. The plurality of first fins are disposed in the first inner surface constituting region. The liquid cooling section has an introduction port via which the liquid refrigerant is introduced from a region outside the liquid cooling section into the liquid cooling section, and a discharge port via which the liquid refrigerant having flowed in the liquid cooling section is discharged to the region outside the liquid cooling section.

According to the configuration described above, the heat produced by the heat source and received by the first plate vaporizes the first working fluid encapsulated in the first vapor chamber, and the gas-phase first working fluid diffuses in the first vapor chamber. The heat of the gas-phase first working fluid is transferred to the second plate, so that the gas-phase first working fluid condenses into the liquid-phase first working fluid at the second plate. The heat of the heat source is thus transferred over a wide range at the second plate.

The heat of the first working fluid transferred to the second plate is transferred to the plurality of first fins disposed in the first inner surface constituting region at the second plate. The plurality of first fins are disposed in the liquid cooling section. The liquid refrigerant introduced via the introduction port flows in the liquid cooling section, and the liquid refrigerant flows along the channels formed by the plurality of first fins. The heat transferred to the plurality of first fins is thus transferred to the liquid refrigerant. The liquid refrigerant to which the heat has been transferred is then discharged to the region outside the liquid cooling section via the discharge port.

The heat of the heat source received by the first vapor chamber can thus be efficiently transferred via the plurality of first fins to the liquid refrigerant flowing in the liquid cooling section. That is, the heat of the heat source can be transferred to the liquid refrigerant more efficiently than in a case where the plurality of first fins are not provided. The heat source can therefore be efficiently cooled.

Additional Remark 2

In the cooling apparatus described in the additional remark 1, the first vapor chamber is formed in a folded shape in which portions of the second plate face each other, and the second plate has a second inner surface constituting region which faces the first inner surface constituting region at the outer surface of the second plate and constitutes at least a part of a second inner surface facing the first inner surface in the liquid cooling section.

According to the configuration described above, the heat of the heat source can be transferred not only to the first inner surface in the liquid cooling section, but also to the second inner surface facing the first inner surface. The heat of the heat source can therefore be transferred to the liquid refrigerant not only via the first inner surface and the plurality of first fins, but also via the second inner surface. Therefore, the efficiency of heat transfer to the liquid refrigerant can be increased, and the efficiency at which the heat source is cooled can in turn be increased.

Additional Remark 3

In the cooling apparatus described in the additional remark 1, the liquid cooling section includes a heat transfer member which is combined with the liquid cooling container to constitute a second inner surface facing the first inner surface in the liquid cooling section, and a heat pipe which thermally couples the first-plate-side outer surface of the first plate, which faces the heat source, to the heat transfer member.

According to the configuration described above, the heat of the heat source can be transferred not only to the first inner surface in the liquid cooling section, but also to the second inner surface facing the first inner surface, as the cooling apparatus according to the additional remark 2 can. The heat of the heat source can therefore be transferred to the liquid refrigerant not only via the first inner surface and the plurality of first fins, but also via the second inner surface. Therefore, the efficiency of heat transfer to the liquid refrigerant can be increased, and the efficiency at which the heat source is cooled can in turn be increased.

Additional Remark 4

In the cooling apparatus described in the additional remark 3, the heat transfer member is a second vapor chamber which is formed of a combination of a third plate and a fourth plate facing the third plate and in which a second working fluid encapsulated in the second vapor chamber vaporizes and condenses.

According to the configuration described above, the heat transferred from the first vapor chamber to the second vapor chamber via the heat pipe can be dispersed at the second inner surface. The heat at the second inner surface can thus be homogenized, and can be efficiently transferred to the liquid refrigerant flowing along the second inner surface. The heat source can therefore be cooled at increased cooling efficiency.

Additional Remark 5

In the cooling apparatus described in the additional remark 3 or 4, the heat pipe includes a coupler coupled to the heat transfer member, and the end of the coupler is located at a position beyond the center, of the first outer surface, in the direction in which the coupler extends along the first outer surface corresponding to the second inner surface in the heat transfer member.

According to the configuration described above, the heat can be transferred from the heat pipe over a wide range of the heat transfer member. The heat at the second inner surface can thus be homogenized, and can be efficiently transferred to the liquid refrigerant flowing along the second inner surface. The heat source can therefore be cooled at increased cooling efficiency.

Additional Remark 6

The cooling apparatus described in any one of the additional remarks 2 to 5 includes a plurality of second fins which are provided at the second inner surface and form a part of the channel.

According to the configuration described above, the heat transferred to the second inner surface can be readily transferred to the liquid refrigerant via the plurality of second fins provided at the second inner surface. The heat source can therefore be more efficiently cooled.

Additional Remark 7

In the cooling apparatus described in the additional remark 6, out of the plurality of first fins and the plurality of second fins, one set of the plurality of first fins and the plurality of second fins is disposed in an upstream region facing the introduction port in the channel, and the other set of the plurality of first fins and the plurality of second fins is disposed in a downstream region facing the discharge port in the channel.

The temperature at a base portion of each of the first fins is higher than the temperature at a tip portion thereof because the heat is more readily transferred to the base portion of each of the first fins than to the tip portion thereof. Similarly, the temperature at the base portion of each of the second fins is higher than the temperature at the tip portion thereof.

The liquid refrigerant flowing between the first inner surface and the second inner surface can therefore suppress an increase in the difference in the temperature of the liquid refrigerant in the direction from the first inner surface toward the second inner surface, whereby the heat of the liquid refrigerant can be homogenized. That is, a local increase in the temperature of the liquid refrigerant can be suppressed, whereby the heat can be efficiently transferred from each of the fins to the liquid refrigerant. The efficiency at which the cooling apparatus cools the heat source can therefore be further increased.

Furthermore, interference between the first fins and the second fins in the flow direction of the liquid refrigerant flowing along the first fins and the second fins can be suppressed. The fins can therefore be readily disposed in the liquid cooling section as compared, for example, with the case where the plurality of second fins are disposed between the plurality of first fins. The liquid cooling section and hence the cooling apparatus can therefore be assembled with increased easiness.

Additional Remark 8

In the cooling apparatus described in the additional remark 6, the plurality of first fins are arranged with a gap therebetween in a first direction, the plurality of second fins are arranged with a gap therebetween in the first direction, and the plurality of first fins and the plurality of second fins overlap with each other when viewed in the first direction and are alternately arranged in the first direction to form a part of the channel.

According to the configuration described above, when the liquid refrigerant flows between the first fins and the second fins, which are alternately arranged, the heat can be readily transferred from each of the first fins and the second fins to the liquid refrigerant. The heat source can therefore be efficiently cooled.

Additional Remark 9

In the cooling apparatus described in the additional remark 6, the plurality of first fins are arranged with a gap therebetween in a first direction, the plurality of second fins are arranged with a gap therebetween in the first direction, and the plurality of first fins and the plurality of second fins are disposed so as to overlap with each other when viewed in the direction in which the plurality of first fins protrude from the first inner surface but so as not to overlap with each other when viewed in the first direction to form a part of the channel.

According to the configuration described above, the heat can be readily transferred from the plurality of first fins to the liquid refrigerant flowing along the side facing the first inner surface, and the heat can be readily transferred from the plurality of second fins to the liquid refrigerant flowing along the side facing the second inner surface.

Since the first fins and the second fins overlap with each other when viewed in the protruding direction, the fins can be readily disposed in the liquid cooling section as compared, for example, with the case where the plurality of second fins are disposed between the plurality of first fins. The liquid cooling section and hence the cooling apparatus can therefore be assembled with increased easiness.

Additional Remark 10

The cooling apparatus described in the additional remark 1 includes a plurality of second fins which are provided at a second inner surface facing the first inner surface in the liquid cooling section and form a part of the channel.

According to the configuration described above, the heat transferred to the second inner surface can be readily transferred to the liquid refrigerant via the plurality of second fins provided at the second inner surface. The heat source can therefore be more efficiently cooled.

Additional Remark 11

In the cooling apparatus described in the additional remark 10, out of the plurality of first fins and the plurality of second fins, one set of the plurality of first fins and the plurality of second fins is disposed in an upstream region facing the introduction port in the channel, and the other set of the plurality of first fins and the plurality of second fins is disposed in a downstream region facing the discharge port in the channel.

The temperature at the base portion of each of the first fins is higher than the temperature at the tip portion thereof, and the temperature at the base of each of the second fins is higher than the temperature at the tip portion thereof.

The liquid refrigerant flowing between the first inner surface and the second inner surface can therefore suppress an increase in the difference in the temperature of the liquid refrigerant in the direction from the first inner surface toward the second inner surface, whereby the heat of the liquid refrigerant can be homogenized. That is, a local increase in the temperature of the liquid refrigerant can be suppressed, whereby the heat can be efficiently transferred from each of the fins to the liquid refrigerant. The efficiency at which the cooling apparatus cools the heat source can therefore be further increased.

Additional Remark 12

In the cooling apparatus described in the additional remark 10, the plurality of first fins are arranged with a gap therebetween in a first direction, the plurality of second fins are arranged with a gap therebetween in the first direction, and the plurality of first fins and the plurality of second fins overlap with each other when viewed in the first direction and are alternately arranged in the first direction to form a part of the channel.

According to the configuration described above, when the liquid refrigerant flows between the first fins and the second fins, which are alternately arranged, the heat can be readily transferred from each of the first fins and the second fins to the liquid refrigerant. The heat source can therefore be efficiently cooled.

Additional Remark 13

In the cooling apparatus described in the additional remark 10, the plurality of first fins are arranged with a gap therebetween in a first direction, the plurality of second fins are arranged with a gap therebetween in the first direction, and the plurality of first fins and the plurality of second fins are disposed so as to overlap with each other when viewed in the direction in which the plurality of first fins protrude from the first inner surface but so as not to overlap with each other when viewed in the first direction to form a part of the channel.

According to the configuration described above, the heat can be readily transferred from the plurality of first fins to the liquid refrigerant flowing along the side facing the first inner surface, and the heat can be readily transferred from the plurality of second fins to the liquid refrigerant flowing along the side facing the second inner surface.

Additional Remark 14

A circulation-type cooling system includes the cooling apparatus described in any one of the additional remarks 1 to 13, a pump which causes the liquid refrigerant to flow to the introduction port, and a radiator which cools the liquid refrigerant discharged via the discharge port.

According to the configuration described above, the liquid refrigerant cooled by the radiator is allowed to flow in the liquid cooling section. Therefore, the efficiency of heat transfer to the liquid refrigerant in the liquid cooling section can be increased, and the efficiency at which the cooling apparatus cools the heat source can be increased.

Additional Remark 15

An electronic instrument includes a heat source and the circulation-type cooling system described in the additional remark 14.

The configuration described above can provide the same effects as those provided by the circulation-type cooling system according to the additional remark 14.

What is claimed is:

1. A cooling apparatus comprising:

a first vapor chamber which is formed of a combination of a first plate that receives heat from a heat source and a second plate facing the first plate and in which a first working fluid encapsulated in the first vapor chamber vaporizes and condenses, wherein the first vapor chamber is formed in a folded shape in which portions of the second plate face each other and the second plate has a second inner surface constituting region which faces a first inner surface constituting region at an outer surface of the second plate and constitutes at least a part of a second inner surface facing the first inner surface;

a liquid cooling section which includes a liquid cooling container combined with the first vapor chamber and in which a liquid refrigerant flowing in the liquid cooling section flows along the first vapor chamber; and a plurality of first fins which are provided in the liquid cooling section and form a part of a channel of the liquid refrigerant, wherein the second plate has the first inner surface constituting region which is located at the outer surface of the second plate and forms at least a part of a first inner surface of the liquid cooling section, the plurality of first fins are disposed in the first inner surface constituting region, and the liquid cooling section has an introduction port via which the liquid refrigerant is introduced from a region outside the liquid cooling section into the liquid cooling section, and a discharge port via which the liquid refrigerant flowing in the liquid cooling section is discharged to the region outside the liquid cooling section.

2. The cooling apparatus according to claim 1, wherein the liquid cooling section includes a heat transfer member which is combined with the liquid cooling container to constitute a second inner surface facing the first inner surface in the liquid cooling section, and a heat pipe which thermally couples a first-plate-side outer surface of the first plate that faces the heat source to the heat transfer member.

3. The cooling apparatus according to claim 2, wherein the heat transfer member is a second vapor chamber which is formed of a combination of a third plate and a fourth plate facing the third plate and in which a second working fluid encapsulated in the second vapor chamber vaporizes and condenses.

4. The cooling apparatus according to claim 2, wherein the heat pipe includes a coupler coupled to the heat transfer member, and an end of the coupler is located at a position beyond a center, of the first outer surface, in a direction in which the coupler extends along the first outer surface corresponding to the second inner surface in the heat transfer member.

5. The cooling apparatus according to claim 1, further comprising a plurality of second fins which are provided at the second inner surface and form a part of the channel.

6. The cooling apparatus according to claim 5, wherein out of the plurality of first fins and the plurality of second fins, one set of the plurality of first fins and the plurality of second fins is disposed in an upstream region facing the introduction port in the channel, and another set of the plurality of first fins and the plurality of second fins is disposed in a downstream region facing the discharge port in the channel.

7. The cooling apparatus according to claim 5, wherein the plurality of first fins are arranged with a gap therebetween in a first direction, the plurality of second fins are arranged with a gap therebetween in the first direction, and the plurality of first fins and the plurality of second fins overlap with each other when viewed in the first direction and are alternately arranged in the first direction to form a part of the channel.

8. The cooling apparatus according to claim 5, wherein the plurality of first fins are arranged with a gap therebetween in a first direction, the plurality of second fins are arranged with a gap therebetween in the first direction, and the plurality of first fins and the plurality of second fins are disposed so as to overlap with each other when viewed in a direction in which the plurality of first fins protrude from the first inner surface but so as not to overlap with each other when viewed in the first direction to form a part of the channel.

9. The cooling apparatus according to claim 1,
further comprising a plurality of second fins which are provided at a second inner surface facing the first inner surface in the liquid cooling section and form a part of the channel.

10. The cooling apparatus according to claim 9,
wherein out of the plurality of first fins and the plurality of second fins,
one set of the plurality of first fins and the plurality of second fins is disposed in an upstream region facing the introduction port in the channel, and
another set of the plurality of first fins and the plurality of second fins is disposed in a downstream region facing the discharge port in the channel.

11. The cooling apparatus according to claim 9,
wherein the plurality of first fins are arranged with a gap therebetween in a first direction,
the plurality of second fins are arranged with a gap therebetween in the first direction, and
the plurality of first fins and the plurality of second fins overlap with each other when viewed in the first direction and are alternately arranged in the first direction to form a part of the channel.

12. The cooling apparatus according to claim 9,
wherein the plurality of first fins are arranged with a gap therebetween in a first direction,
the plurality of second fins are arranged with a gap therebetween in the first direction, and
the plurality of first fins and the plurality of second fins are disposed so as to overlap with each other when viewed in a direction in which the plurality of first fins protrude from the first inner surface but so as not to overlap with each other when viewed in the first direction to form a part of the channel.

13. A circulation-type cooling system comprising:
the cooling apparatus according to claim 1;
a pump which causes the liquid refrigerant to flow to the introduction port; and
a radiator which cools the liquid refrigerant discharged via the discharge port.

14. An electronic instrument comprising a heat source and the circulation-type cooling system according to claim 13.

15. A cooling apparatus comprising:
a first vapor chamber which is formed of a combination of a first plate that receives heat from a heat source and a second plate facing the first plate and in which a first working fluid encapsulated in the first vapor chamber vaporizes and condenses;
a liquid cooling section comprising:
a liquid cooling container combined with the first vapor chamber and in which a liquid refrigerant flowing in the liquid cooling section flows along the first vapor chamber;
a heat transfer member which is combined with the liquid cooling container to constitute a second inner surface facing a first inner surface in the liquid cooling section; and
a heat pipe which thermally couples a first-plate-side outer surface of the first plate that faces the heat source to the heat transfer member;
a plurality of first fins which are provided in the liquid cooling section and form a part of a channel of the liquid refrigerant,
wherein the second plate has a first inner surface constituting region which is located at an outer surface of the second plate and forms at least a part of a first inner surface of the liquid cooling section,
the plurality of first fins are disposed in the first inner surface constituting region, and
the liquid cooling section has
an introduction port via which the liquid refrigerant is introduced from a region outside the liquid cooling section into the liquid cooling section, and
a discharge port via which the liquid refrigerant flowing in the liquid cooling section is discharged to the region outside the liquid cooling section.

16. The cooling apparatus according to claim 15,
wherein the heat transfer member is a second vapor chamber which is formed of a combination of a third plate and a fourth plate facing the third plate and in which a second working fluid encapsulated in the second vapor chamber vaporizes and condenses.

17. The cooling apparatus according to claim 15,
further comprising a plurality of second fins which are provided at a second inner surface facing the first inner surface in the liquid cooling section and form a part of the channel.

18. The cooling apparatus according to claim 17,
wherein out of the plurality of first fins and the plurality of second fins,
one set of the plurality of first fins and the plurality of second fins is disposed in an upstream region facing the introduction port in the channel, and
another set of the plurality of first fins and the plurality of second fins is disposed in a downstream region facing the discharge port in the channel.

19. The cooling apparatus according to claim 17,
wherein the plurality of first fins are arranged with a gap therebetween in a first direction,
the plurality of second fins are arranged with a gap therebetween in the first direction, and
the plurality of first fins and the plurality of second fins overlap with each other when viewed in the first direction and are alternately arranged in the first direction to form a part of the channel.

20. The cooling apparatus according to claim 17,
wherein the plurality of first fins are arranged with a gap therebetween in a first direction,
the plurality of second fins are arranged with a gap therebetween in the first direction, and
the plurality of first fins and the plurality of second fins are disposed so as to overlap with each other when viewed in a direction in which the plurality of first fins protrude from the first inner surface but so as not to overlap with each other when viewed in the first direction to form a part of the channel.

* * * * *